(12) United States Patent
Katti

(10) Patent No.: US 11,150,312 B2
(45) Date of Patent: Oct. 19, 2021

(54) ACCELEROMETER USING MAGNETIC TUNNEL JUNCTION

(71) Applicant: Honeywell International Inc., Morris Plains, NJ (US)

(72) Inventor: Romney R. Katti, Shorewood, MN (US)

(73) Assignee: Honeywell International Inc., Charlotte, NC (US)

( * ) Notice: Subject to any disclaimer, the term of this patent is extended or adjusted under 35 U.S.C. 154(b) by 88 days.

(21) Appl. No.: 16/774,427

(22) Filed: Jan. 28, 2020

(65) Prior Publication Data

US 2020/0249287 A1 Aug. 6, 2020

Related U.S. Application Data

(60) Provisional application No. 62/799,991, filed on Feb. 1, 2019.

(51) Int. Cl.
*G01R 33/09* (2006.01)
*H01L 43/02* (2006.01)

(52) U.S. Cl.
CPC ......... *G01R 33/098* (2013.01); *G01R 33/091* (2013.01); *G01R 33/093* (2013.01); *H01L 43/02* (2013.01)

(58) Field of Classification Search
CPC ...... H01L 43/02; G01R 33/093; G01R 33/091
See application file for complete search history.

(56) References Cited

U.S. PATENT DOCUMENTS

| | | | | |
|---|---|---|---|---|
| 2007/0099031 | A1* | 5/2007 | Chung | G11C 11/16 428/815 |
| 2011/0310663 | A1* | 12/2011 | Bessho | G11C 11/161 365/173 |
| 2015/0091397 | A1* | 4/2015 | Miller | H02N 11/008 310/44 |
| 2017/0160308 | A1* | 6/2017 | Alaoui | G01P 15/18 |

\* cited by examiner

*Primary Examiner* — Alvaro E Fortich
(74) *Attorney, Agent, or Firm* — Shumaker & Sieffert, P.A.

(57) ABSTRACT

A magnetic tunnel junction (MTJ) based sensor device includes a first MTJ element, a first reservoir, a second MTJ element, a second reservoir, and processing circuitry. The first reservoir includes first particles configured to move within the first reservoir during acceleration. A first portion of the first reservoir is electrically coupled to a free layer of the first MTJ element. The second reservoir includes second particles configured to move within the second reservoir during acceleration. A first portion of the second reservoir is electrically coupled to a free layer of the second MTJ element. The processing circuitry is configured to determine an acceleration based on a first output voltage at a pinned layer at the first MTJ element and a second output voltage at a pinned layer at the second MTJ element.

20 Claims, 14 Drawing Sheets

ACCELEROMETER USING MAGNETIC TUNNEL JUNCTION

This Application claims the benefit of U.S. Provisional Patent Application 62/799,991, filed Feb. 1, 2019, the entire content of which is hereby incorporated by reference.

TECHNICAL FIELD

This disclosure relates to sensor devices and, more specifically, to devices that are configured to detect acceleration using a magnetic tunnel junction.

BACKGROUND

Some devices include an accelerometer that monitors acceleration of a device. It is desirable for such devices to detect acceleration of the device to provide context of the device. For example, a position of the device may be controlled based on the acceleration of the device. It is generally desirable for an accelerometer to accurately measure acceleration and to operate in a smaller space. Current types of accelerometers include piezoelectric displacement transducers that generate a voltage when deformed by an acceleration.

SUMMARY

This disclosure generally describes techniques for detecting acceleration using a sensor device with a magnetic tunnel junction. The techniques may in some instances provide for a higher density for a smaller and more lightweight form factor. Furthermore, a spintronic-based sensor device may be more resistive to ElectroMagnetic Interference (EMI) than a piezoelectric displacement transducer, which may be of particular benefit to certain applications.

In one example, a magnetic tunnel junction (MTJ) based sensor device includes: a first MTJ element comprising a free layer, a tunnel barrier, and a pinned layer, the tunnel barrier of the first MTJ element being arranged between the free layer of the first MTJ element and the pinned layer of the first MTJ element; a first reservoir comprising first particles configured to move within the first reservoir during acceleration of the MTJ based sensor device, wherein a first portion of the first reservoir is electrically coupled to the free layer of the first MTJ element and wherein a second portion of the first reservoir is electrically coupled to a first supply voltage; a second MTJ element comprising a free layer, a tunnel barrier, and a pinned layer, the tunnel barrier of the second MTJ element being arranged between the free layer of the second MTJ element and the pinned layer of the second MTJ element; a second reservoir comprising second particles configured to move within the second reservoir during acceleration of the MTJ based sensor device, wherein a first portion of the second reservoir is electrically coupled to the free layer of the second MTJ element and wherein a second portion of the second reservoir is electrically coupled to a second supply voltage; and processing circuitry configured to determine an acceleration based on a first output voltage at the pinned layer at the first MTJ element and a second output voltage at the pinned layer at the second MTJ element.

In another example, a method for detecting acceleration using a MTJ based sensor device includes: comparing, by processing circuitry, a first output voltage at a first MTJ element and a second output voltage at a second MTJ element; wherein the first MTJ element comprises a free layer, a tunnel barrier, and a pinned layer, the tunnel barrier of the first MTJ element being arranged between the free layer of the first MTJ element and the pinned layer of the first MTJ element; wherein the second MTJ element comprises a free layer, a tunnel barrier, and a pinned layer, the tunnel barrier of the second MTJ element being arranged between the free layer of the second MTJ element and the pinned layer of the second MTJ element; wherein a first reservoir comprises first particles configured to move within the first reservoir during acceleration of the MTJ based sensor device, wherein a first portion of the first reservoir is electrically coupled to the free layer of the first MTJ element and wherein a second portion of the first reservoir is electrically coupled to a first supply voltage; wherein a second reservoir comprises second particles configured to move within the second reservoir during acceleration of the MTJ based sensor device, wherein a first portion of the second reservoir is electrically coupled to the free layer of the second MTJ element and wherein a second portion of the second reservoir is electrically coupled to a second supply voltage; and determining, by the processing circuitry, acceleration based on the comparison of the first output voltage at the first MTJ element and the second output voltage at the second MTJ element.

In one example, a MTJ based sensor device includes: means for comparing a first output voltage at a first MTJ element and a second output voltage at a second MTJ element; wherein the first MTJ element comprises a free layer, a tunnel barrier, and a pinned layer, the tunnel barrier of the first MTJ element being arranged between the free layer of the first MTJ element and the pinned layer of the first MTJ element; wherein the second MTJ element comprises a free layer, a tunnel barrier, and a pinned layer, the tunnel barrier of the second MTJ element being arranged between the free layer of the second MTJ element and the pinned layer of the second MTJ element; wherein a first reservoir comprises first particles configured to move within the first reservoir during acceleration of the MTJ based sensor device, wherein a first portion of the first reservoir is electrically coupled to the free layer of the first MTJ element and wherein a second portion of the first reservoir is electrically coupled to a first supply voltage; wherein a second reservoir comprises second particles configured to move within the second reservoir during acceleration of the MTJ based sensor device, wherein a first portion of the second reservoir is electrically coupled to the free layer of the second MTJ element and wherein a second portion of the second reservoir is electrically coupled to a second supply voltage; and means for determining acceleration based on the comparison of the first output voltage at the first MTJ element and the second output voltage at the second MTJ element.

The details of one or more aspects of the disclosure are set forth in the accompanying drawings and the description below. Other features, objects, and advantages of the devices, systems, methods, and techniques described in this disclosure will be apparent from the description and drawings, and from the claims.

DETAILED DESCRIPTION

Figure 1A:
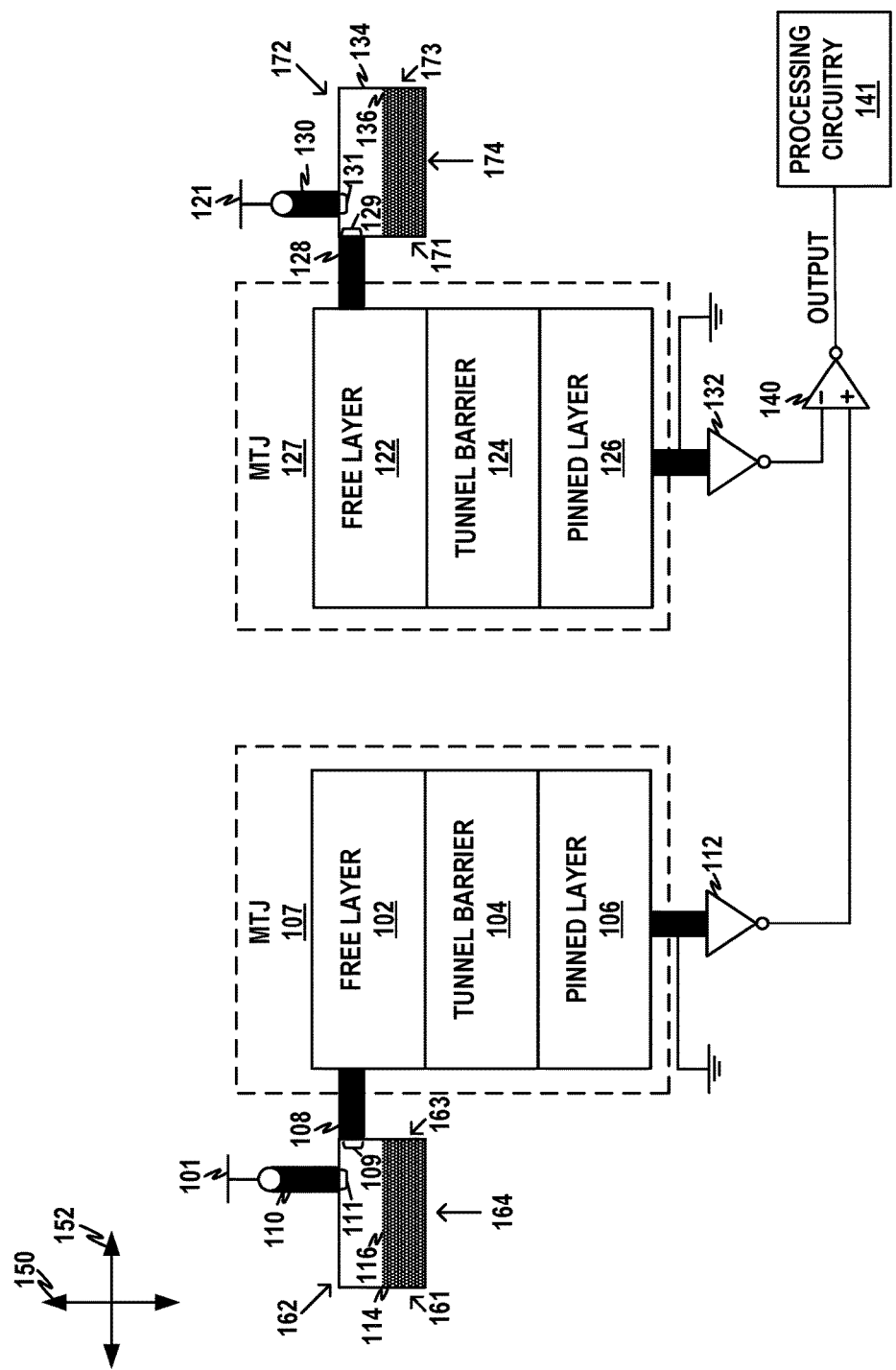
FIG. 1A shows a conceptual illustration of a first sensor configured to detect acceleration.

Some applications have been identified in which miniaturized sensing devices are needed for operation in unique environments. Such sensing devices may be configurable for strategic applications. For example, such sensing devices may be radiation-hardened, and include magnetically-based devices that can be integrated (e.g., monolithically, in particular initially) into a compact module with Application-Specific Integrated Circuits (ASICs) including those that contain embedded Magnetoresistive Random Access Memory (MRAM) bits. Of various sensing devices of interest, one device of interest that is discussed here is an acceleration sensor device that could be used with or separately from other sensors (e.g., a gyroscope, a mechanical shock and vibration sensor, etc.), and that may support compatibility with MRAM technology.

There is a need for advanced sensors, including sensors that can support denser and greater levels of integration and support/leverage process compatibility, such as accelerometers, that meet unique environmental requirements, including performance and radiation, and offer advantages for unique applications, such as space and flight applications.

An example for a magnetic accelerometer is described herein to provide unique configurations that support denser and greater levels of integration. In some examples, two Magnetic Tunnel Junction (MTJs) are used, which have free layer, tunnel barrier, and pinned layer structures. The MTJs can be similar or differentiated, depending on requirements and response preferences. Connected to each free layer is an encapsulated region (e.g., a reservoir) containing conductive non-magnetic or magnetic, or ferromagnetic or possibly ferrimagnetic or paramagnetic, particles, either partially filled or suspended in air or in a fluid. For an adjacent pair of MTJs, a first MTJ ("MTJ1") and a second MTJ ("MTJ2") which are not connected to each other, there may be two encapsulated regions, "ER1 and ER2. In some examples, ER1 is connected to the left side (e.g., one side) of the free layer of MTJ1, and ER2 is connected to the right side (e.g., the opposite side) of the free layer of MTJ2. A contact is made to the right side (e.g., one side) of ER1 and a contact is made to the left side (e.g., the opposite side) of ER2. In the presence of an acceleration in one axis in the plane of the films, contact voltage bias is made and completed with one MTJ and not the other, and this signal, based on readback of resistance, conductance, and/or tunneling current through the MTJ (using the Tunneling Magneto-Resistance, or TMR, effect which alternatively could be revised to invoke GMR, or Giant Magneto-Resistance, or AMR, or Anisotropic Magneto-Resistance effects) could be amplified, compared, and/or data processed to determine whether acceleration was occurring. Physical rotation by 90 degrees of such a structure can identify accelerations in an orthogonal planar direction for this second axis. For the remaining axis for vertical acceleration, in one embodiment, an encapsulated region can be placed above the free layer of one MTJ and another encapsulated region can be placed below the pinned layer of another MTJ, and contacts can be offset to the two encapsulated regions to determine "vertical" accelerations for this third axis.

Such magnetic/spintronic devices may provide unique and desired application functionality, customization prospects, and environmental capability (e.g., shock, vibration, radiation, motion, etc.) for various environments. Such magnetic/spintronic devices may offer materials and technological similarity and compatibility with MRAM bits and other sensing devices such as accelerometers, gyros, and pressure sensors, which may support integration, modularity, miniaturization, and packaging with embedded MRAM and ASICS. In some examples, the spintronic-based accelerometer described herein may be used for die-to-die or monolithic integration with MTJs/MTJ die.

FIG. 1A shows a conceptual illustration of a first sensor 100 configured to detect acceleration. MTJ based sensor device 100 (also referred to herein as simply "sensor 100") may include supply 101, MTJ element 107, reservoir 114, supply 121, MTJ element 127, and reservoir 134. As shown in FIG. 1A, first reservoir 114, and second reservoir 134 extend along first direction 150 (e.g., a vertical direction) and second direction 152 (e.g., a horizontal direction). First direction 150 is perpendicular to second direction 152. As shown, first reservoir 114 comprises first surface 161 (e.g., a left surface), second surface 162 (e.g., a top surface), third surface 163 (e.g., a right surface) opposite from first surface 161, and fourth surface 164 (e.g., a bottom surface) opposite from second surface 162. Similarly, second reservoir 134 comprises first surface 171, second surface 172, third surface 173 opposite from first surface 171, and fourth surface 174 opposite from second surface 172.

Surfaces 161-164 of first reservoir 114 may correspond to surfaces 171-174 of second reservoir with respect to first direction 150 and second direction 152. For example, first surface 161 of first reservoir 114 may be spaced apart along second direction 152 from third surface 163 of first reservoir 114 and second surface 162 of first reservoir 114 may be spaced apart along first direction 150 from fourth surface 164 of first reservoir 114. Similarly, first surface 171 of second reservoir 134 may be spaced apart along second direction 152 from third surface 173 of second reservoir 134 and second surface 172 of second reservoir 134 may be spaced apart along first direction 150 from fourth surface 174 of second reservoir 134.

Sensor devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions.

Supply 101 may be configured to output a regulated voltage, current, or power. For example, supply 101 may output a first supply voltage. Similarly, supply 121 may be configured to output a regulated voltage, current, or power. For example, supply 121 may output a second supply voltage. In some examples, a voltage, current, or power output by supply 101 may correspond to (e.g., equal to) a voltage, current, or power output by supply 121. For instance, the first supply voltage output by supply 101 may correspond to the second supply voltage output by supply 121. In some examples, supply 121 may be omitted and supply 101 is electrically coupled to conductor 130. In some instances, the first supply voltage output by supply 101 may be different from (e.g., greater than or less than) the second supply voltage output by supply 121. In some examples, supply 101 and/or supply 121 may generate the regulated output to be a direct current (DC) regulated voltage, current, or power. In some examples, supply 101 and/or supply 221 may generate the regulated output to be an alternating current (AC) regulated voltage, current, or power.

MTJ element 107 includes free layer 102, tunnel barrier 104, and pinned layer 106. Free layer 102 may include a magnetization direction that is free to switch between a parallel orientation and an antiparallel orientation. Free layer 102 may include a magnetized portion. The magnetized portion may include, for example, but not limited to, a metal and/or a metal/ferromagnetic metal system. For instance, the magnetized portion of free layer 102 may be formed of a metal or metal/ferromagnetic metal system on Silicon Oxide (SiOx), Silicon Nitride (SiNx), Tetraethyl orthosilicate (TEOS), and/or Silicon (Si).

Tunnel barrier 104 includes a non-magnetic metal that separates free layer 102 and pinned layer 106. In some examples, tunnel barrier 104 may be formed of aluminum oxide, magnesium oxide, or another material. In the example of FIG. 1A, free layer 102 is spaced apart from tunnel barrier 104 along first direction 150. As shown, tunnel barrier 104 may be arranged between free layer 102 and pinned layer 106.

A resistance of MTJ element 107 may be controlled by adjusting a thickness of tunnel barrier 104. Moreover, a size of the MTJ element 507 may be significantly smaller than a resistive element formed using, for example, carbon. As such, sensors using an MTJ may be smaller compared to sensors using resistive elements.

Pinned layer 106 may include a magnetization direction that is fixed or "pinned" to a single orientation. For example, pinned layer 106 may be pinned in a parallel orientation. In other examples, pinned layer 106 may be pinned in an antiparallel orientation. In the example of FIG. 1A, pinned layer 106 may include an anti-ferromagnetic layer, such that the magnetization direction of the pinned layer 106 is "pinned" in a particular orientation the magnetization direction of the pinned layer 106 remains relatively fixed when operational magnetic fields are applied to MTJ element 107. In some examples, MTJ element 107 may be under bias and/or no tunnel currents may flow.

MTJ element 127 includes free layer 122, tunnel barrier 124, and pinned layer 126, which may be substantially similar to free layer 102, tunnel barrier 104, and pinned layer 106. For example, free layer 122 may include a magnetization direction that is free to switch between a parallel orientation and an antiparallel orientation. Free layer 122 may include a magnetized portion. Tunnel barrier 124 may include a non-magnetic metal that separates free layer 122 and pinned layer 126. In some examples, tunnel barrier 124 may be formed of aluminum oxide, magnesium oxide, or another material. Pinned layer 126 may include a magnetization direction that is fixed or "pinned" to a single orientation. In some examples, MTJ element 127 may be under bias and/or no tunnel currents may flow.

Reservoir 114 and/or reservoir 134 may be formed of silicon, silicon nitride, an oxide, TEOS, or another material. First particles 116 (also referred to herein as simply "particles 116") and/or second particles 136 (also referred to herein as simply "particles 136") may be formed of a ferrofluid and/or magnetic, non-magnetic, paramagnetic, ferrimagnetic, or ferromagnetic-fluid. Particles 116 and/or particles 136 may be coated with a surfactant to mitigate agglomeration. Examples of materials for a ferromagnetic-fluid may include, but are not limited to, for example, nickel-iron or a nickel-iron alloy. Particles 116 and/or particles 136 may be electrically conductive. In some examples, particles 116 and/or particles 136 may include modified fill quantities/ratios, fluid viscosity, and/or particle density. Particles 116 may be placed in reservoir 114 with or without a fluid. Similarly, particles 136 may be placed in reservoir 134 with or without a fluid.

Conductors 108, 110, 128, and 130 may be formed on an electrically conductive material. Examples of an electrically conductive material may include, for example, but are not limited to, one or more of gold, silver, copper, aluminum, chromium, platinum, or another electrically conductive material. In the example of FIG. 1A, conductor 108 is arranged at third surface 163 of reservoir 114 and conductor 110 is arranged at second surface 162 of reservoir 114. Similarly, conductor 128 is arranged at first surface 171 of reservoir 134 and conductor 130 is arranged at second surface 172 of reservoir 134.

In the example of FIG. 1A, a position of particles 116 and/or particles 136 is used to detect an acceleration of sensor 100. For example, particles 116 may electrically couple conductor 108 and conductor 110 when arranged within an upper right corner of reservoir 114. In another examples, particles 136 may electrically couple conductor 128 and conductor 130 when arranged within an upper left corner of reservoir 134.

For example, as shown in FIG. 1A, first portion 109 of first reservoir 114 may be arranged on third surface 163 of first reservoir 114. Second portion 111 of first reservoir 114 may be arranged on second surface 162 of first reservoir 114. In some examples, second surface 162 of first reservoir 114 may be adjacent to third surface 163 of first reservoir 114. In the example of FIG. 1A, particles 116 may electronically couple first portion 109 of first reservoir 114 and second portion 111 of first reservoir 114 when particles 116 are arranged within an upper-right corner of first reservoir 114. In some examples, the upper-right corner of first reservoir 114 may be formed by second surface 162 of first reservoir 114 and third surface 163 of first reservoir 114.

As shown, first portion 129 of second reservoir 134 may be arranged on first surface 171 of second reservoir 134. Second portion 131 of second reservoir 134 may be arranged on second surface 172 of second reservoir 134. In some examples, second surface 172 of second reservoir 134 may be adjacent to first surface 171 of second reservoir 134. In the example of FIG. 1A, particles 136 may electronically couple first portion 129 of second reservoir 134 and second portion 131 of second reservoir 134 when particles 136 are arranged within an upper-left corner of second reservoir 134. In some examples, the upper-left corner of second reservoir 134 may be formed by second surface 172 of second reservoir 134 and first surface 171 of second reservoir 134.

Amplifier 112 may be configured to amplify a first output voltage at pinned layer 106 corresponding to a resistance, conductance, and/or tunneling current through MTJ element 107 (using the Tunneling Magneto-Resistance, or TMR, effect which alternatively could be revised to invoke GMR, or Giant Magneto-Resistance, or AMR, or Anisotropic Magneto-Resistance effects). Similarly, amplifier 132 may be configured to amplify a second output voltage at pinned layer 126 corresponding to a resistance, conductance, and/or tunneling current through MTJ element 127 (using the TMR, effect which alternatively could be revised to invoke GMR or AMR, or Anisotropic Magneto-Resistance effects). In some examples, amplifier 112 and/or amplifier 132 may be omitted.

Comparator 140 may be configured determine an acceleration at sensor 100 based on a first output voltage at pinned layer 106 and a second output voltage at pinned layer 126. For example, comparator 140 may be configured to output a logical '1' when the first output voltage at pinned layer 106 is greater than the second output voltage at pinned layer 126. Comparator 140 may be configured to output a logical '0' when the first output voltage at pinned layer 106 is not greater than the second output voltage at pinned layer 126.

Processing circuitry 141 (e.g., with or without comparator 140) may be configured determine an acceleration at sensor 100 has occurred in response to determining that the first output voltage at pinned layer 106 exceeds the second output voltage at pinned layer 126 by at least a first voltage threshold. In some examples, processing circuitry 141 (e.g., with or without comparator 140) may be configured determine an acceleration at sensor 100 has occurred in response to determining that the second output voltage at pinned layer 126 exceeds the first output voltage at pinned layer 106 by at least a second voltage threshold. In some examples, the first voltage threshold is the same as the second voltage threshold. In some examples, the first voltage threshold is different from (e.g., greater than or less than) the second voltage threshold.

However, processing circuitry 141 (e.g., with or without comparator 140) may be configured determine an acceleration at sensor 100 has not occurred in response to determining that the first output voltage at pinned layer 106 does not exceed the second output voltage at pinned layer 126 by at least the first voltage threshold and the second output voltage at pinned layer 126 does not exceed the first output voltage at pinned layer 106 by at least the second voltage threshold.

Processing circuitry 141 may be configured to monitor an output of comparator 140. This monitoring of the output may represent a real time measuring of a state of particles 116 within reservoir 114 compared to a state of particles 136 within reservoir 134. In some examples, processing circuitry 141 may determine that an acceleration is increasing in response to a difference of voltage increasing from a threshold voltage corresponding to no acceleration. In some examples, processing circuitry 141 may determine that no acceleration has occurred (e.g., constant velocity) in response to the output indicating no difference of voltage at pinned layer 106 and at pinned layer 126.

Processing circuitry 141 may detect acceleration using voltage at MTJ element 507 and voltage at MTJ element 527. As used in this disclosure, the term acceleration may refer to both positive acceleration and negative acceleration. Negative acceleration is also sometimes referred to as deceleration. For example, particles of a reservoir may move to a portion of the reservoir that is away from a direction of positive acceleration or move to a portion of the reservoir that is toward a direction of negative acceleration.

Processing circuitry 141 may include one or more processors, including one or more microprocessors, digital signal processors (DSPs), ASICs, field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

Although the example of FIG. 1A illustrates an example placement, geometry, stack, materials, and connections, in other examples, a placement, a geometry, a stack, materials, and/or connections may be different. For example, a geometry of reservoir 114 and/or reservoir 134 may be different. In some examples, one or more of conductor 108 or conductor 110 may be positioned differently with reservoir 114 and one or more of conductor 128 or conductor 130 may be positioned differently with reservoir 134.

In some examples, processing circuitry 141 may determine a magnitude of acceleration by conductivity (e.g., voltage division) or ensemble of devices. In some examples, processing circuitry 141 may use a pair of in-plane sensor devices. In some examples, processing circuitry 141 may use multiple sampled contacts and/or modified reservoir geometry and fill quantities and/or ratios.

Figure 1B:
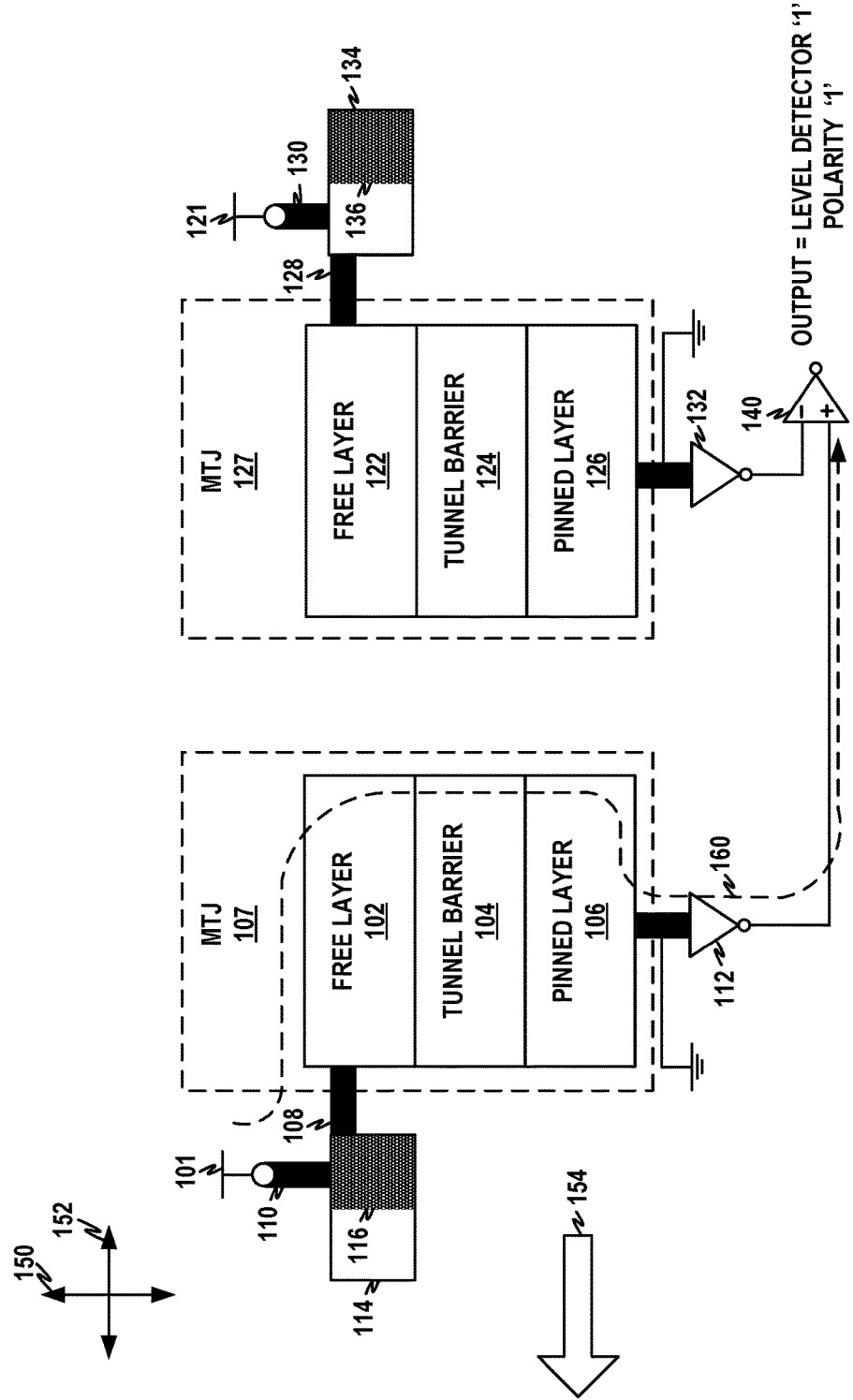
FIG. 1B shows a conceptual illustration of the first sensor of FIG. 1A during a first acceleration.

FIG. 1B shows a conceptual illustration of first sensor 100 of FIG. 1A during a first acceleration. In this example, MTJ element 107 and/or MTJ element 127 may be under bias and/or tunnel current flows in one device. In the example of FIG. 1B, acceleration 154 is only along second direction 152 (e.g., to the left) and causes particles 116 to move to a right side of reservoir 114 (e.g., accurate to the right), which electrically couples conductor 108 and conductor 110 such that supply 101 provides acceleration signal 160 through MTJ element 107 to comparator 140. In this example, acceleration 154 is only along second direction 152 and causes particles 136 to move to a right side of reservoir 134, which does not electrically couple conductor 128 and conductor 130 and supply 121 provides no acceleration signal through MTJ element 127 to comparator 140. Accordingly, comparator 140 may generate a polarity output of '1' in response to voltage at a positive pin of comparator 140 for MTJ element 107 being greater than voltage at a negative pin of comparator 140 for MTJ element 127. In some examples, comparator 140 may generate a level detector of '1' to indicate that voltage at the positive pin of comparator 140 for MTJ element 107 is not equal to voltage at the negative pin of comparator 140 for MTJ element 127.

Figure 1C:
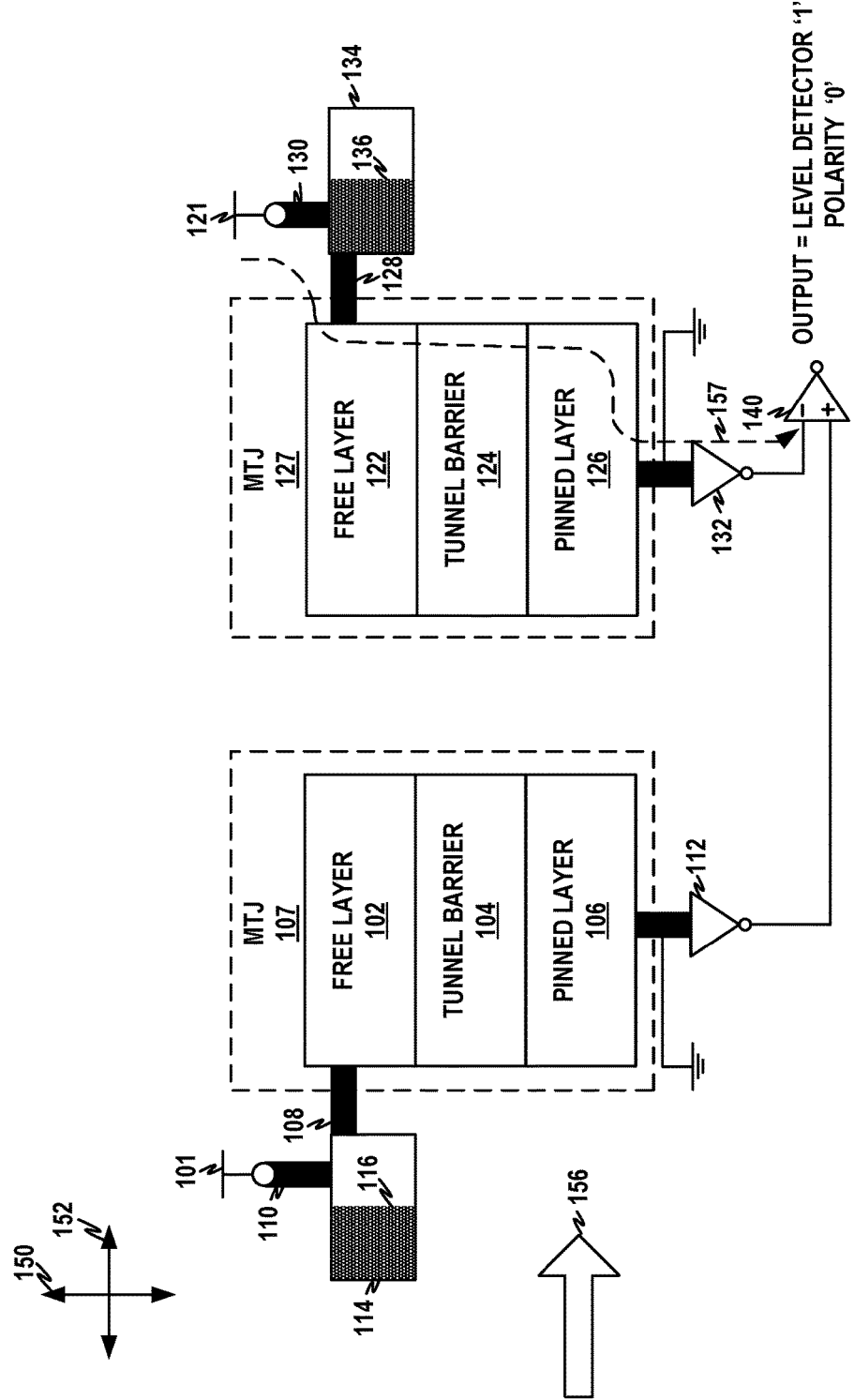
FIG. 1C shows a conceptual illustration of the first sensor of FIG. 1A during a second acceleration.

FIG. 1C shows a conceptual illustration of first sensor 100 of FIG. 1A during a second acceleration. In this example, MTJ element 107 and/or MTJ element 127 may be under bias and/or tunnel current flows in one device. In the example of FIG. 1C, acceleration 156 is only along second direction 152 (e.g., to the right) and causes particles 116 to move to a left surface 161 of reservoir 114, which does not electrically couple conductor 108 and conductor 110 and supply 101 provides no acceleration signal through MTJ element 107 to comparator 140. In this example, acceleration 154 is only along second direction 152 and causes particles 136 to move to left surface 171 of reservoir 134, which electrically couples conductor 128 and conductor 130 such that supply 121 provides acceleration signal 157 through MTJ element 127 to comparator 140. Accordingly, comparator 140 may generate a polarity output of '0' in response to voltage at a positive pin of comparator 140 for MTJ element 107 being not greater than voltage at a negative pin of comparator 140 for MTJ element 127. In some examples, comparator 140 may generate a level detector of '1' to indicate that voltage at the positive pin of comparator 140 for MTJ element 107 is not equal to voltage at the negative pin of comparator 140 for MTJ element 127.

Figure 1D:
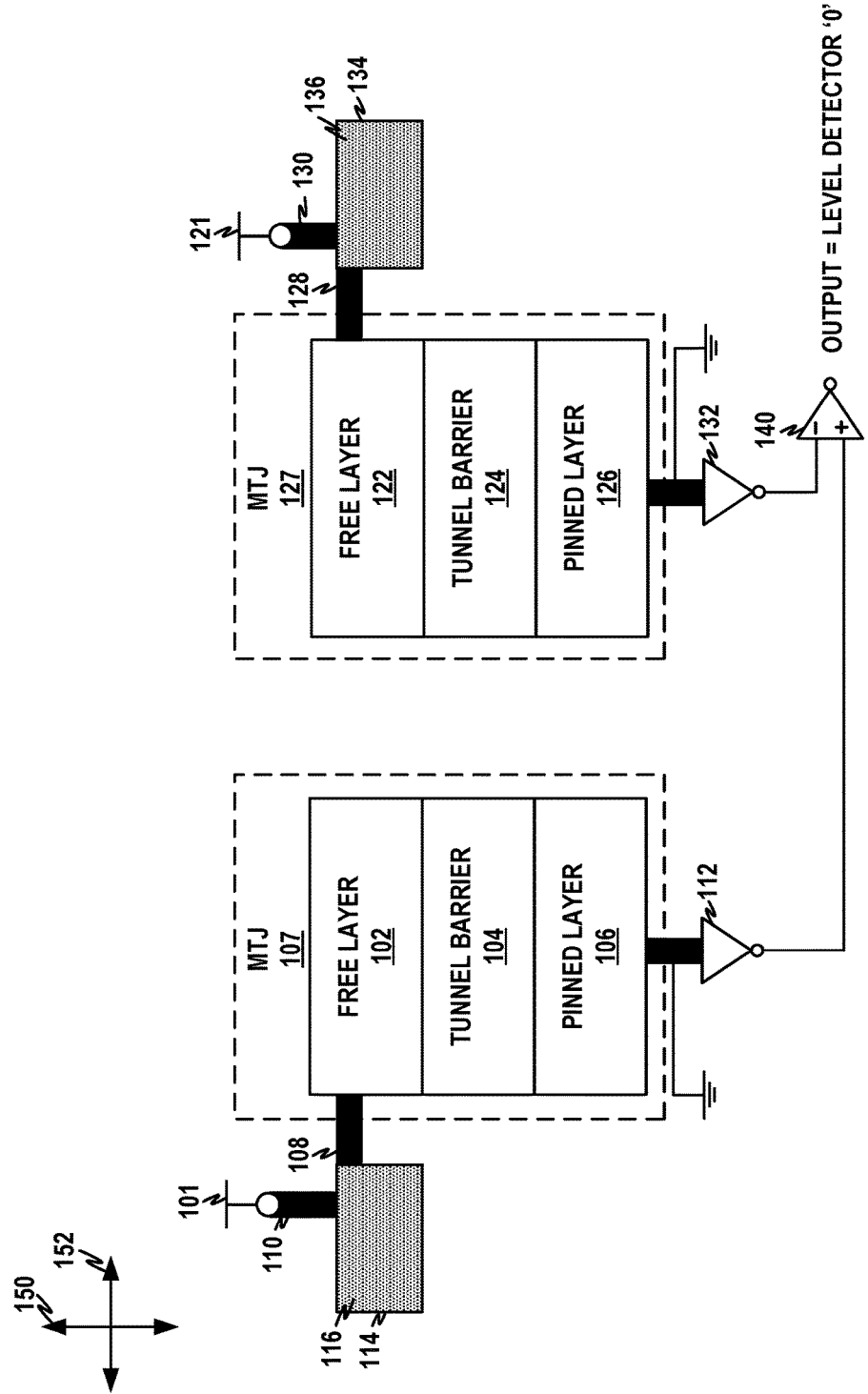
FIG. 1D shows a conceptual illustration of the first sensor of FIG. 1A without acceleration in zero gravity.

FIG. 1D shows a conceptual illustration of first sensor 100 of FIG. 1A without acceleration in zero gravity. In the example of FIG. 1D, no acceleration causes particles 116 to distribute randomly and/or uniformly within reservoir 114, which electrically couples conductor 108 and conductor 110 and supply 101 provides an acceleration signal through MTJ element 107 to comparator 140. In this example, no acceleration causes particles 136 to distribute randomly and/or uniformly within reservoir 134, which electrically couples conductor 128 and conductor 130 such that supply 121 provides an acceleration signal through MTJ element 127 to comparator 140. Accordingly, comparator 140 may generate a level detector of '0' to indicate that voltage at the positive pin of comparator 140 for MTJ element 107 is equal to voltage at the negative pin of comparator 140 for MTJ element 127.

Figure 2:
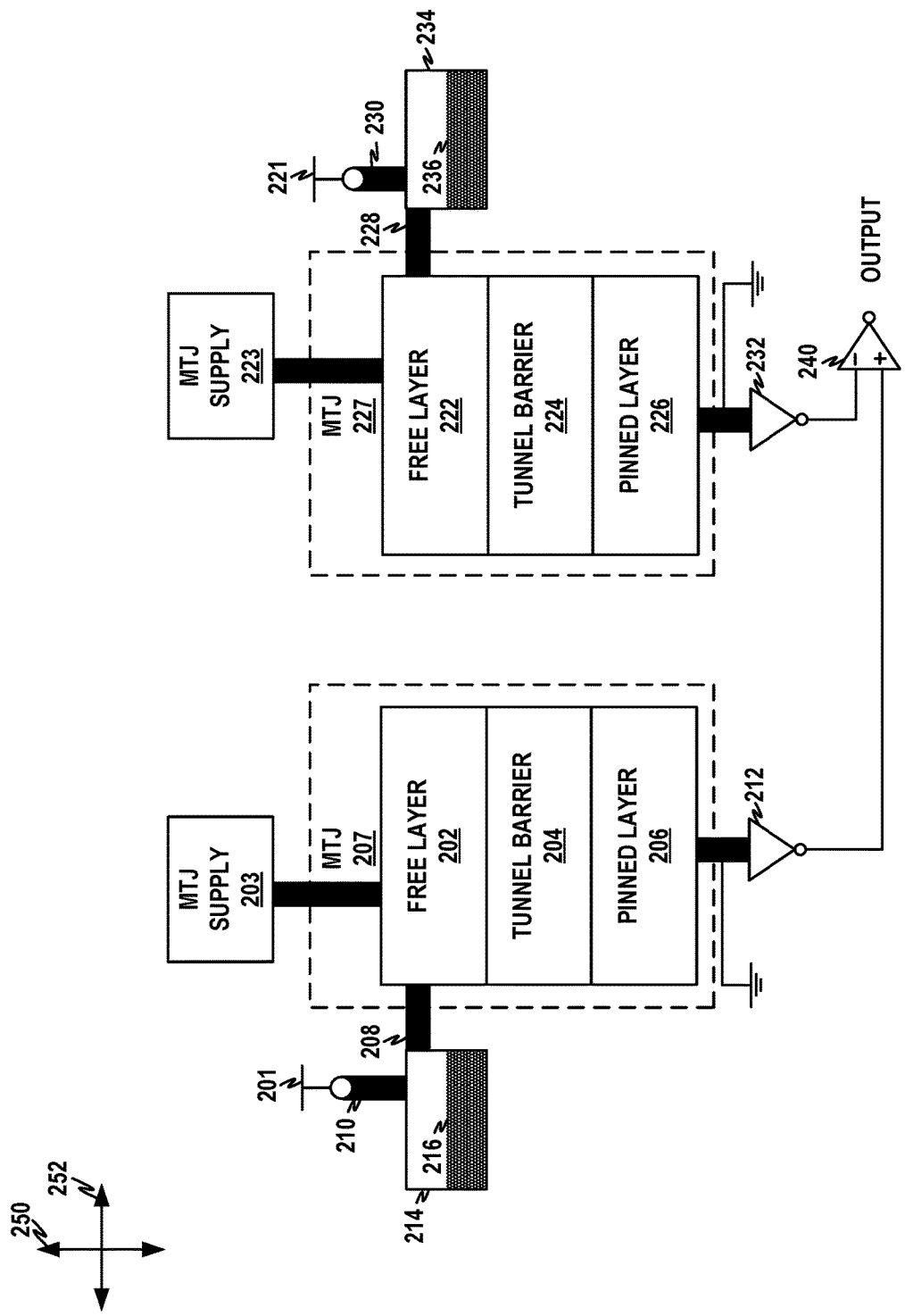
FIG. 2 shows a conceptual illustration of a second sensor configured to detect acceleration.

FIG. 2 shows a conceptual illustration of a second sensor 200 configured to detect acceleration. Sensor 200 may include supply 201, MTJ element 207, conductor 208, conductor 210, amplifier 212, reservoir 214, particles 216, supply 221, MTJ element 227, conductor 228, conductor 230, amplifier 232, reservoir 234, particles 236, and comparator 240, which may be examples of supply 101, MTJ element 107, conductor 108, conductor 110, amplifier 112, reservoir 114, particles 116, supply 121, MTJ element 127, conductor 128, conductor 130, amplifier 132, reservoir 134, particles 136, and comparator 140 of FIG. 1A, respectively. As shown, MTJ element 207 may include free layer 202, tunnel barrier 204, and pinned layer 206 and MTJ element 227 may include free layer 222, tunnel barrier 224, and pinned layer 226. Reservoir 214 and reservoir 234 extend along first direction 250 (e.g., a vertical direction) and second direction 252 (e.g., a horizontal direction). First direction 250 is perpendicular to second direction 252.

In the example of FIG. 2, MTJ supply 203 may provide an electrical signal, referred to herein as a "third supply voltage," to free layer 202, which is conducted via tunnel barrier 204 and pinned layer 206 to a reference node (e.g., ground) of MTJ supply 203. Although FIG. 2 shows MTJ supply 203 as directly connected to free layer 202, in some examples, MTJ supply 203 is electronically coupled to free layer 202 via one or more other layers (e.g., a top electrode). Similarly, although FIG. 2 shows pinned layer 206 as directly connected to a ground node of MTJ supply 203, in some examples, pinned layer 206 is electronically coupled to the ground node of MTJ supply 203 via one or more other layers (e.g., a bottom electrode).

MTJ supply 203 may be coupled to free layer 202 using a conductor extending along first direction 250 and/or along a direction perpendicular to second direction 252 and first direction 250 (e.g., into or out of the page). In some examples, MTJ supply 203 may generate a magnetic field at MTJ element 207 using a DC or AC current or a DC or AC magnetic field from the current.

Similarly, MTJ supply 223 may provide an electrical signal, referred to herein as a "fourth supply voltage," to free layer 222, which is conducted via tunnel barrier 224 and pinned layer 226 to a reference node (e.g., ground) of MTJ supply 223. Although FIG. 2 shows MTJ supply 223 as directly connected to free layer 222, in some examples, MTJ supply 223 is electronically coupled to free layer 222 via one or more other layers (e.g., a top electrode). Similarly, although FIG. 2 shows pinned layer 226 as directly connected to a ground node of MTJ supply 223, in some examples, pinned layer 226 is electronically coupled to the ground node of MTJ supply 223 via one or more other layers (e.g., a bottom electrode).

MTJ supply 223 may be coupled to free layer 222 using a conductor extending along first direction 250 and/or along a direction perpendicular to second direction 252 and first direction 250 (e.g., into or out of the page). In some examples, MTJ supply 223 may generate a magnetic field at MTJ element 227 using a DC or AC current or a DC or AC magnetic field from the current.

In some examples, MTJ supply 203 and/or MTJ supply 223 may generate the electrical signal to be a DC electrical signal. In some examples, MTJ supply 203 and/or MTJ supply 223 may generate the electrical signal to be an AC electrical signal. For example, supply 201 and supply 221 may generate DC regulated voltages and MTJ supply 203 and MTJ supply 223 may generate DC or AC electrical signals. In some examples, supply 201 and supply 221 may generate AC regulated voltages and MTJ supply 203 and MTJ supply 223 may generate DC or AC electrical signals. MTJ supply 203 and MTJ supply 223 may improve a signal-to-noise ratio of voltages output to comparator 240. In some examples, MTJ supply 203 may output a third supply voltage and MTJ supply 223 may output a fourth supply voltage that corresponds (e.g., equals) the third supply voltage. However, in some examples, MTJ supply 203 may output a third supply voltage and MTJ supply 223 may output a fourth voltage different from (e.g., less than or greater than) the third voltage.

Figure 3A:
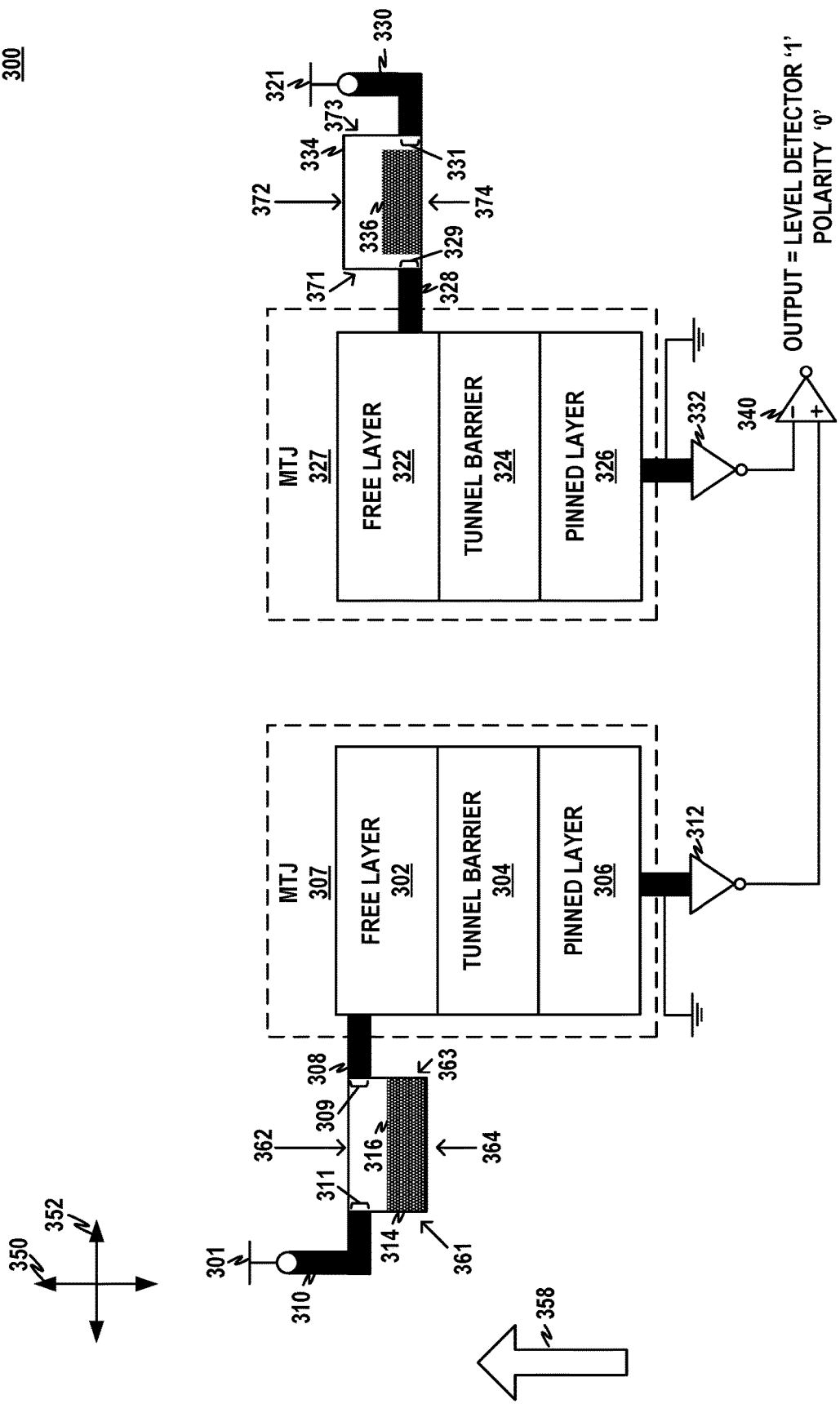
FIG. 3A shows a conceptual illustration of a third sensor configured to detect acceleration during a first acceleration.

FIG. 3A shows a conceptual illustration of a third sensor 300 configured to detect acceleration during a first acceleration. Sensor 300 may include supply 301, MTJ element 307, conductor 308, conductor 310, amplifier 312, reservoir 314, particles 316, supply 321, MTJ element 327, conductor 328, conductor 330, amplifier 332, reservoir 334, particles 336, and comparator 340, which may be examples of supply 101, MTJ element 107, conductor 108, conductor 110, amplifier 112, reservoir 114, particles 116, supply 121, MTJ element 127, conductor 128, conductor 130, amplifier 132, reservoir 134, particles 136, and comparator 140 of FIG. 1A, respectively.

As shown, MTJ element 307 may include free layer 302, tunnel barrier 304, and pinned layer 306 and MTJ element 327 may include free layer 322, tunnel barrier 324, and pinned layer 326. In this example, MTJ element 307 and/or MTJ element 327 may be under bias and/or tunnel current flows in one device. Particles 336 are illustrated as spaced apart from left surface 371 and right side 373 only to show first portion 329 and second portion 331. That is, in some examples, particles 336 may extend to the left to directly contact first surface 371 and extend to the right to directly contact third surface 373.

In the example of FIG. 3A, first reservoir 314, and second reservoir 334 extend along first direction 350 (e.g., a vertical direction) and second direction 352 (e.g., a horizontal direction). First direction 350 is perpendicular to second direction 352. As shown, first reservoir 314 comprises first surface 361, second surface 362, third surface 363 opposite from first surface 361, and fourth surface 364 opposite from second surface 362. Similarly, second reservoir 334 comprises first surface 371, second surface 372, third surface 373 opposite from first surface 371, and fourth surface 374 opposite from second surface 372.

Surfaces 361-364 of first reservoir 314 may correspond to surfaces 371-374 of second reservoir with respect to first direction 350 and second direction 352. For example, first surface 361 of first reservoir 314 may be spaced apart along second direction 352 from third surface 363 of first reservoir 314 and second surface 362 of first reservoir 314 may be spaced apart along first direction 354 from fourth surface 364 of first reservoir 314. Similarly, first surface 371 of second reservoir 334 may be spaced apart along second direction 352 from third surface 373 of second reservoir 334 and second surface 372 of second reservoir 334 may be spaced apart along first direction 354 from fourth surface 374 of second reservoir 334.

In the example of FIG. 3A, conductor 308 is arranged at third surface 363 of reservoir 314 and conductor 310 is arranged at first surface 361 of reservoir 314. Similarly, conductor 328 is arranged at first surface 371 of reservoir 334 and conductor 330 is arranged at second surface 372 of reservoir 334.

For example, first portion 309 of first reservoir 314 may be arranged on third surface 363 of first reservoir 314. Second portion 311 of first reservoir 314 may be arranged on first surface 361 of first reservoir 314. First surface 361 of first reservoir 314 and third surface 363 of first reservoir 314 may be on opposite sides of first reservoir 314. In the example of FIG. 3A, first portion 309 of first reservoir 314 may be spaced closer to second surface 362 of first reservoir 314 than fourth surface 364 of first reservoir 314. Second surface 362 of first reservoir 314 and fourth surface 364 of first reservoir 314 may be on opposite sides of first reservoir 314. Similarly, second portion 311 of first reservoir 314 may be spaced closer to second surface 362 of first reservoir 314 than fourth surface 364 of first reservoir 314. In the example of FIG. 3A, particles 316 may electronically couple first portion 309 of first reservoir 314 and second portion 311 of first reservoir 314 when particles 316 are arranged closer to second surface 362 of first reservoir 314 than fourth surface 364 of first reservoir 314.

First portion 329 of second reservoir 334 may be arranged on first surface 371 of second reservoir 334. Second portion 331 of second reservoir 334 may be arranged on third surface 373 of second reservoir 334. In some examples, third surface 373 of second reservoir 334 and first surface 371 of second reservoir 334 may be on opposite sides of second reservoir 334. In the example of FIG. 3A, first portion 329 of second reservoir 334 may be spaced closer to fourth surface 374 of second reservoir 334 than second surface 372 of second reservoir 334. In some examples, fourth surface 374 of second reservoir 334 and second surface 372 of second reservoir 334 may be on opposite sides of second reservoir 334. Similarly, second portion 331 of second reservoir 334 may be spaced closer to fourth surface 374 of second reservoir 334 than second surface 372 of second reservoir 334. In the example of FIG. 3A, particles 336 may electronically couple first portion 329 of second reservoir 334 and second portion 331 of second reservoir 334 when particles 336 are spaced closer to fourth surface 374 of second reservoir 334 than second surface 372 of second reservoir 334.

Acceleration 358 along only first direction 350 (e.g., upward) causes particles 316 to move to a bottom of reservoir 314, which does not electrically couple conductor 308 and conductor 310 and supply 301 provides no acceleration signal through MTJ element 307 to comparator 340. In this example, acceleration 358 only along first direction 350 causes particles 336 to move to a bottom of reservoir 334, which electrically couples conductor 328 and conductor 330 such that supply 321 provides an acceleration signal through MTJ element 327 to comparator 340. Accordingly, comparator 340 may generate a polarity output of '0' in response to voltage at a positive pin of comparator 340 for MTJ element 307 being not greater than voltage at a negative pin of comparator 340 for MTJ element 327. In some examples, comparator 340 may generate a level detector of '1' to indicate that voltage at the positive pin of comparator 340 for MTJ element 307 is not equal to voltage at the negative pin of comparator 340 for MTJ element 327.

Figure 3B:
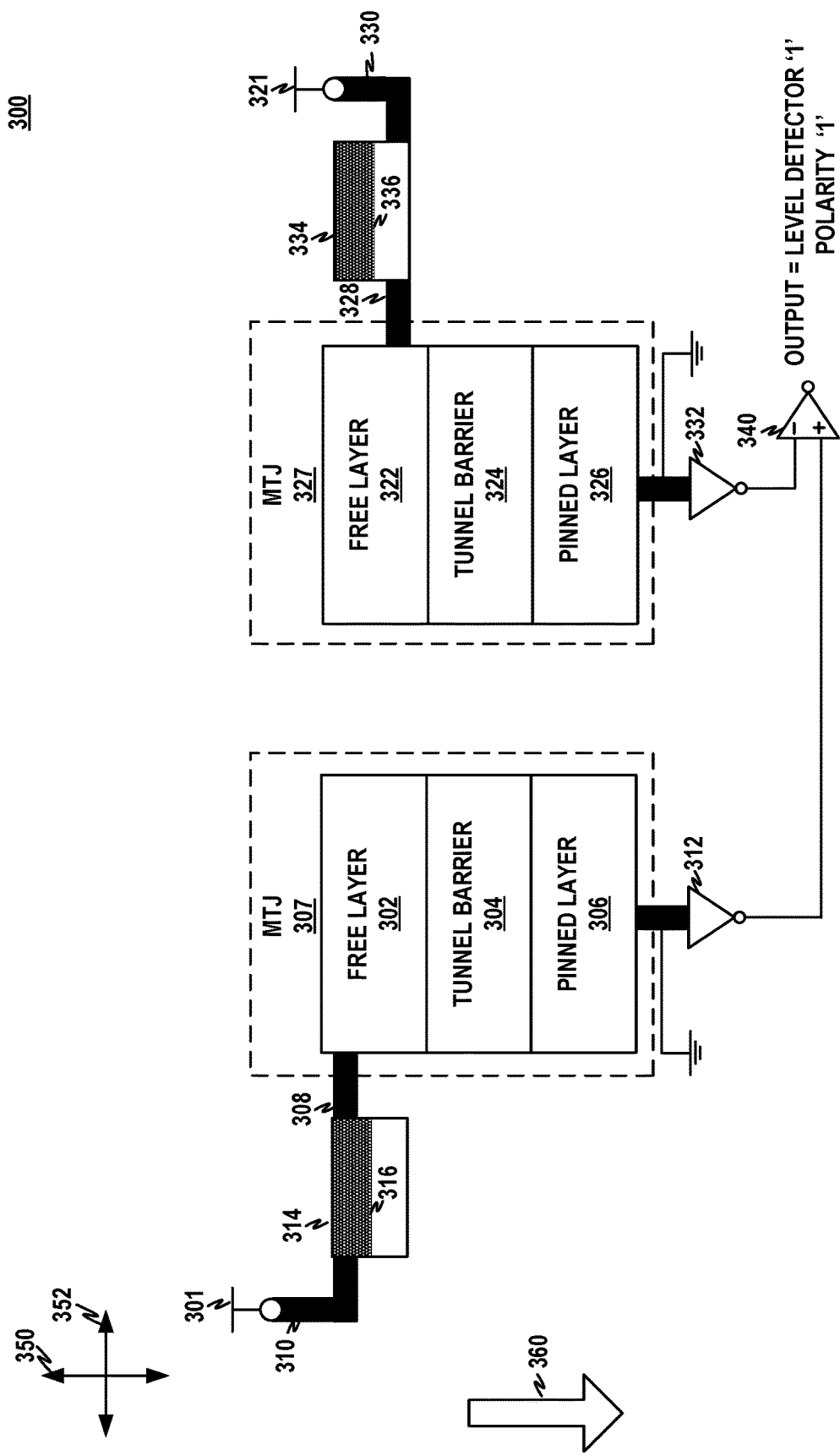
FIG. 3B shows a conceptual illustration of the third sensor of FIG. 3A during a second acceleration.

FIG. 3B shows a conceptual illustration of third sensor 300 of FIG. 3A during a second acceleration. In this example, MTJ element 307 and/or MTJ element 327 may be under bias and/or tunnel current flows in one device. In the example of FIG. 3B, acceleration 360 only along first direction 350 (e.g., downward) causes particles 316 to move to a top of reservoir 314, which electrically couples conductor 308 and conductor 310 such that supply 301 provides an acceleration signal through MTJ element 307 to comparator 340. In this example, acceleration 360 along second direction 352 causes particles 336 to move to a bottom of reservoir 334, which does not electrically couple conductor 328 and conductor 330 and supply 321 provides no acceleration signal through MTJ element 327 to comparator 340. Accordingly, comparator 340 may generate a polarity output of '1' in response to voltage at a positive pin of comparator 340 for MTJ element 307 being greater than voltage at a negative pin of comparator 340 for MTJ element 327. In some examples, comparator 340 may generate a level detector of '1' to indicate that voltage at the positive pin of comparator 340 for MTJ element 307 is not equal to voltage at the negative pin of comparator 340 for MTJ element 327.

Figure 3C:
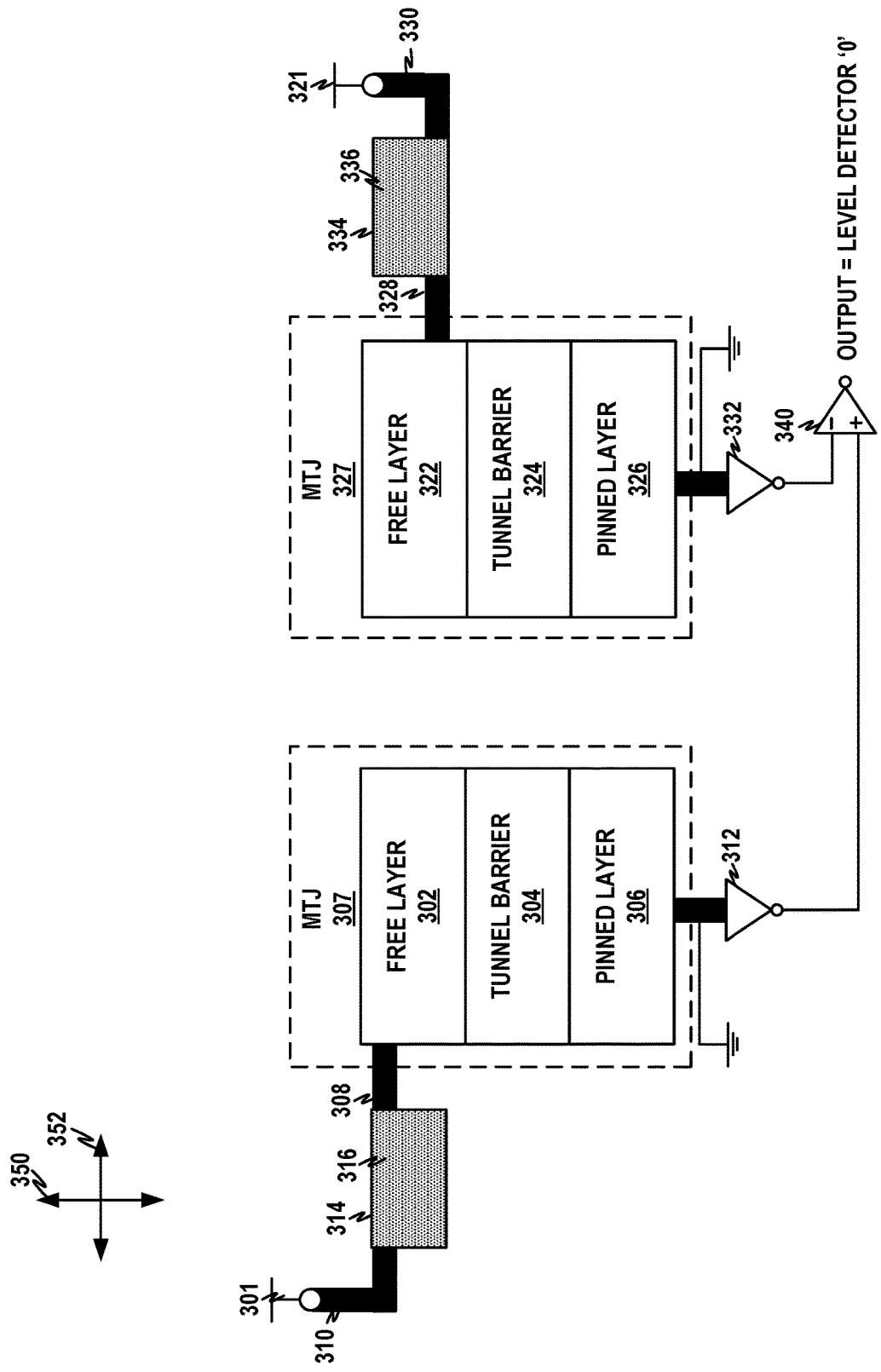
FIG. 3C shows a conceptual illustration of the third sensor of FIG. 3A without acceleration in zero gravity.

FIG. 3C shows a conceptual illustration of third sensor 300 of FIG. 3A without acceleration in zero gravity. In this example, MTJ element 307 and/or MTJ element 327 may be under bias and/or comparable or no tunnel current flow. In the example of FIG. 3C, no acceleration (e.g., freefall or zero gravity) causes particles 316 to distribute randomly and/or uniformly within reservoir 314, which electrically couples conductor 308 and conductor 310 and supply 301 provides an acceleration signal through MTJ element 307 to comparator 340. In this example, no acceleration causes particles 336 to distribute randomly and/or uniformly within reservoir 334, which electrically couples conductor 328 and conductor 330 such that supply 321 provides an acceleration signal through MTJ element 327 to comparator 340. Accordingly, comparator 340 may generate a level detector of '0' to indicate that voltage at the positive pin of comparator 340 for MTJ element 307 is equal to voltage at the negative pin of comparator 340 for MTJ element 327. In this way, processing circuitry may resolve a lack of acceleration.

Figure 3D:
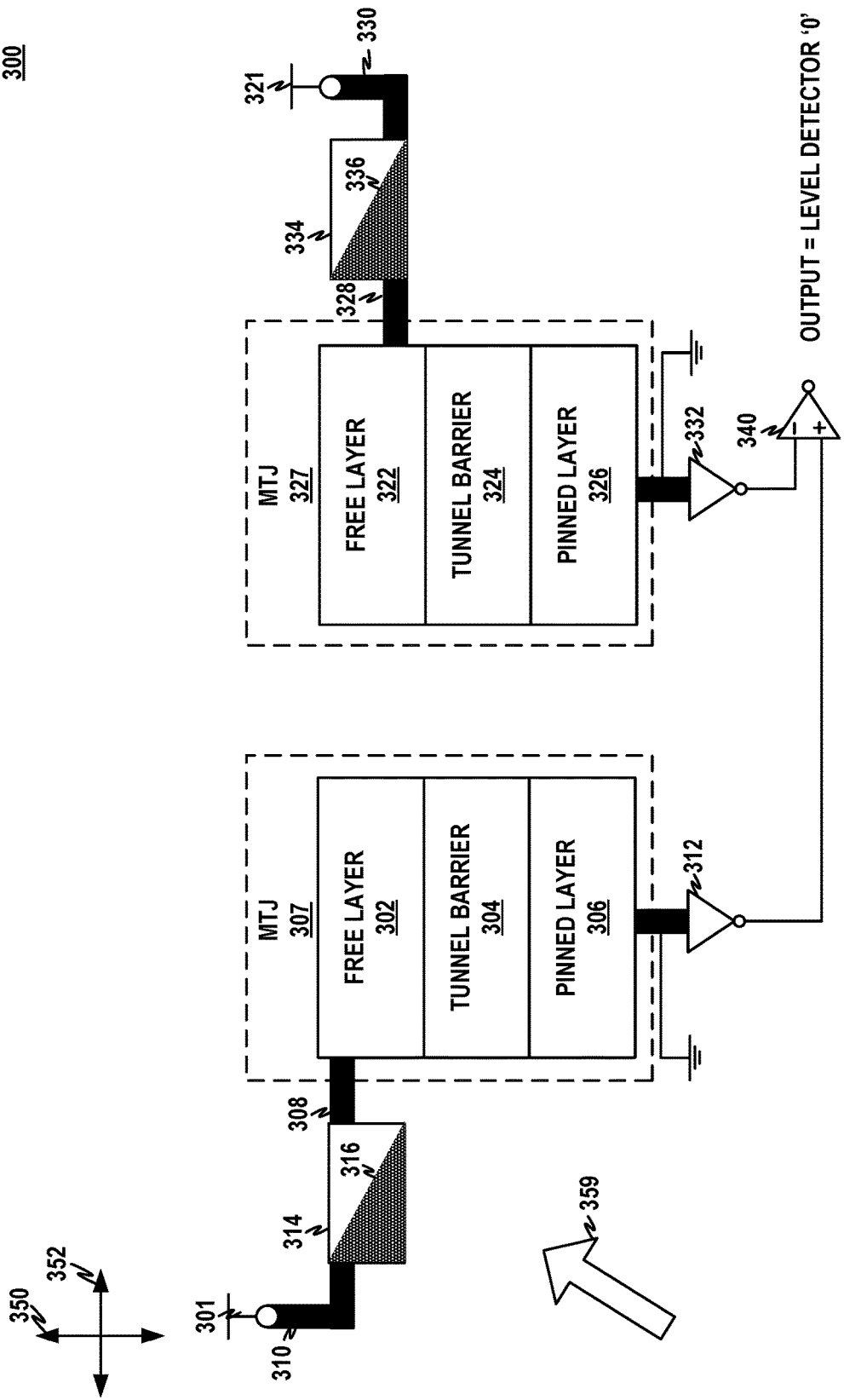
FIG. 3D shows a conceptual illustration of the third sensor of FIG. 3A during a third acceleration.

FIG. 3D shows a conceptual illustration of third sensor 300 of FIG. 3A during a third acceleration. In this example, MTJ element 307 and/or MTJ element 327 may be under bias and/or comparable or no tunnel current flow. In the example of FIG. 3D, acceleration 359 along second direction 352 (e.g., to the right) and first direction 350 (e.g., upward) causes particles 316 to distribute along a bottom-left portion within reservoir 314, which does not electrically couple conductor 308 and conductor 310 and supply 301 provides no acceleration signal through MTJ element 307 to comparator 340. In this example, acceleration 359 along second direction 352 and first direction 350 causes particles 336 to distribute along a lower-left portion within reservoir 334, which does not electrically couple conductor 328 and conductor 330 and supply 321 provides no acceleration signal through MTJ element 327 to comparator 340. Accordingly, comparator 340 may generate a level detector of '0' to indicate that voltage at the positive pin of comparator 340 for MTJ element 307 is equal to voltage at the negative pin of comparator 340 for MTJ element 327. In some examples, sensor 300 may include additional contacts for sampling in sequence, to optimize reservoir geometry, and/or fill quantities/ratios.

Figure 3E:
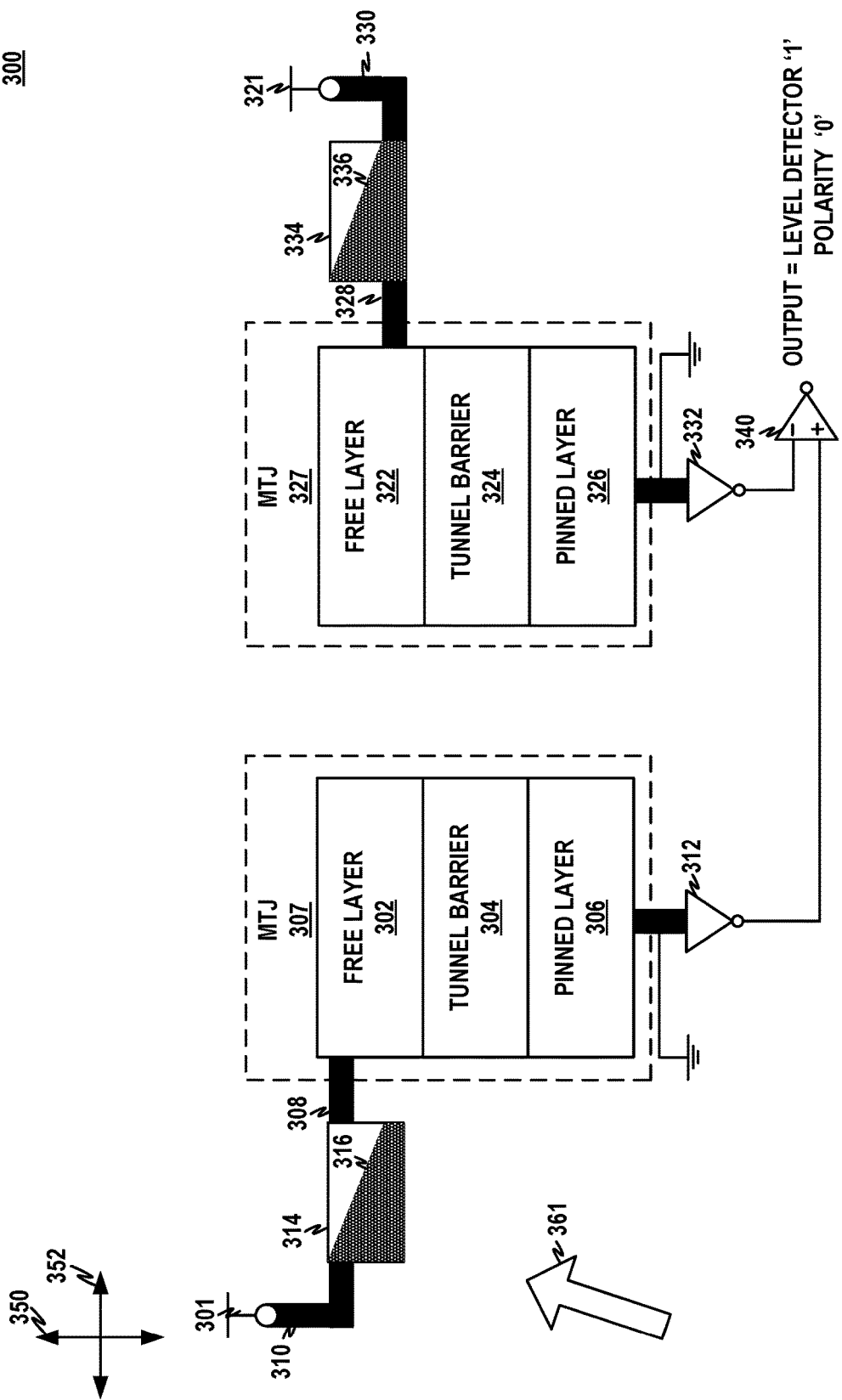
FIG. 3E shows a conceptual illustration of the third sensor of FIG. 3A during a fourth acceleration.

FIG. 3E shows a conceptual illustration of third sensor 300 of FIG. 3A during a fourth acceleration. In the example of FIG. 3E, acceleration 361 along second direction 352 and first direction 350 causes particles 316 to distribute along a bottom-lower-left portion within reservoir 314, which does not electrically couple conductor 308 and conductor 310 and supply 301 provides no acceleration signal through MTJ element 307 to comparator 340. In this example, acceleration 361 along second direction 352 and first direction 350 causes particles 336 to distribute along a bottom-lower-left portion within reservoir 334, which electrically couples conductor 328 and conductor 330 and supply 321 provides an acceleration signal through MTJ element 327 to comparator 340. Accordingly, comparator 340 may generate a polarity output of '0' in response to voltage at a positive pin of comparator 340 for MTJ element 307 being not greater than voltage at a negative pin of comparator 340 for MTJ element 327. In some examples, comparator 340 may generate a level detector of '1' to indicate that voltage at the positive pin of comparator 340 for MTJ element 307 is not equal to voltage at the negative pin of comparator 340 for MTJ element 327.

Figure 4:
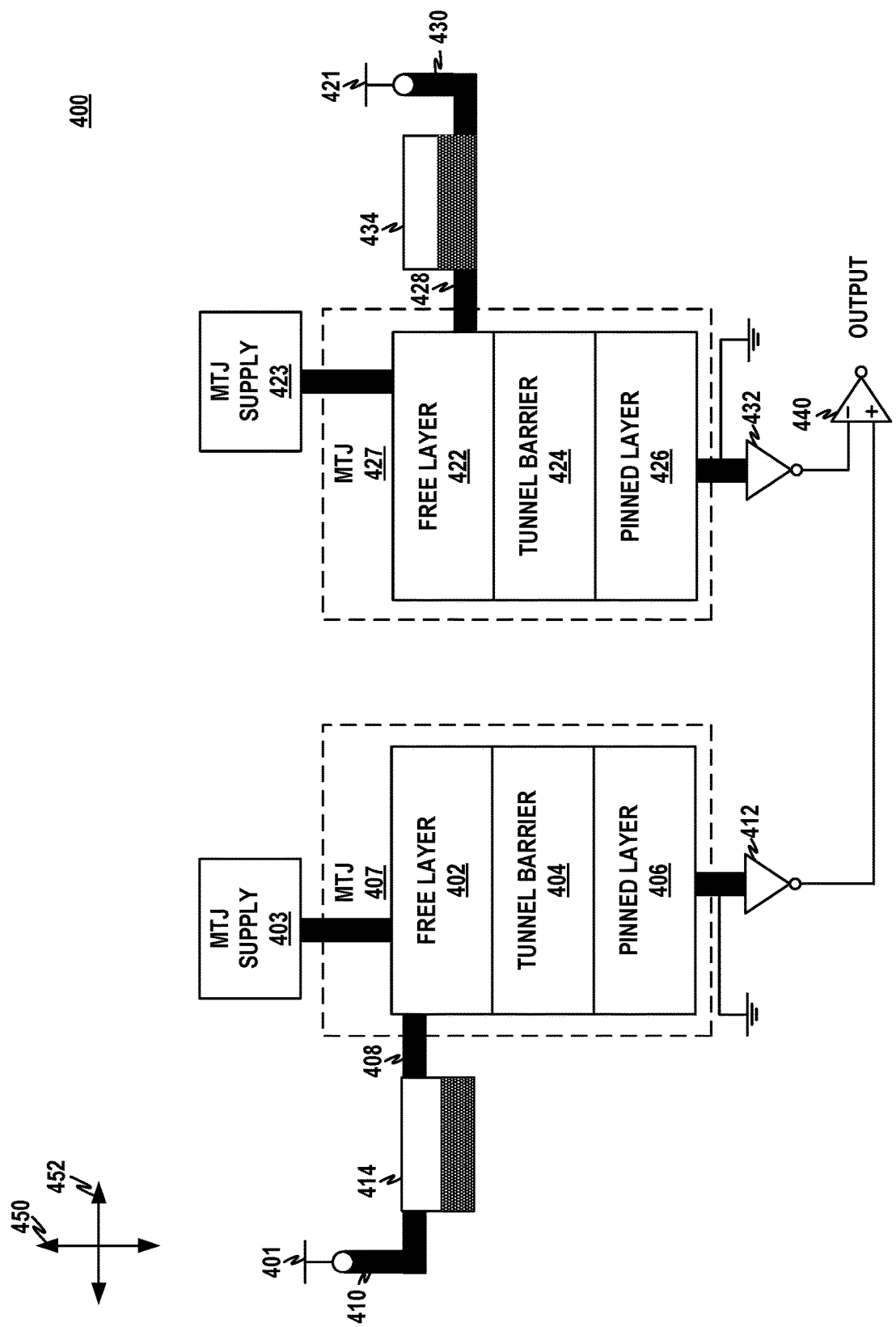
FIG. 4 shows a conceptual illustration of a fourth sensor configured to detect acceleration.

FIG. 4 shows a conceptual illustration of a fourth sensor 400 configured to detect acceleration. Sensor 400 may include supply 401, MTJ element 407, conductor 408, conductor 410, amplifier 412, reservoir 414, particles 416, supply 421, MTJ element 427, conductor 428, conductor 430, amplifier 432, reservoir 434, particles 436, and comparator 440, which may be examples of supply 101, MTJ element 107, conductor 108, conductor 110, amplifier 112, reservoir 114, particles 116, supply 121, MTJ element 127, conductor 128, conductor 130, amplifier 132, reservoir 134, particles 136, and comparator 140 of FIG. 1A, respectively. As shown, MTJ element 407 may include free layer 402, tunnel barrier 404, and pinned layer 406 and MTJ element 427 may include free layer 422, tunnel barrier 424, and pinned layer 426. Reservoir 414 and reservoir 434 extend along first direction 450 and second direction 452. First direction 450 is perpendicular to second direction 452.

In the example of FIG. 4, MTJ supply 403 may provide an electrical signal, also referred to herein as a "third supply voltage," to free layer 402, which is conducted via tunnel barrier 404 and pinned layer 406 to a reference node (e.g., ground) of MTJ supply 403. Although FIG. 4 shows MTJ supply 403 as directly connected to free layer 402, in some examples, MTJ supply 403 is electronically coupled to free layer 402 via one or more other layers (e.g., a top electrode). Similarly, although FIG. 4 shows pinned layer 406 as directly connected to a ground node of MTJ supply 403, in some examples, pinned layer 406 is electronically coupled to the ground node of MTJ supply 403 via one or more other layers (e.g., a bottom electrode).

MTJ supply 403 may be coupled to free layer 402 using a conductor extending along first direction 450 and/or along a direction perpendicular to second direction 452 and first direction 450 (e.g., into or out of the page). In some examples, MTJ supply 403 may generate a magnetic field at MTJ element 407 using a DC or AC current or a DC or AC magnetic field from the current.

Similarly, MTJ supply 423 may provide an electrical signal, also referred to herein as a "fourth supply voltage," to free layer 422, which is conducted via tunnel barrier 424 and pinned layer 426 to a reference node (e.g., ground) of MTJ supply 423. Although FIG. 4 shows MTJ supply 423 as directly connected to free layer 422, in some examples, MTJ supply 423 is electronically coupled to free layer 422 via one or more other layers (e.g., a top electrode). Similarly, although FIG. 4 shows pinned layer 426 as directly connected to a ground node of MTJ supply 423, in some examples, pinned layer 426 is electronically coupled to the ground node of MTJ supply 423 via one or more other layers (e.g., a bottom electrode).

MTJ supply 423 may be coupled to free layer 422 using a conductor extending along first direction 450 and/or along a direction perpendicular to second direction 452 and first direction 450 (e.g., into or out of the page). In some examples, MTJ supply 423 may generate a magnetic field at MTJ 427 using a DC or AC current or a DC or AC magnetic field from the current.

In some examples, MTJ supply 403 and/or MTJ supply 423 may generate the electrical signal to be a DC electrical signal. In some examples, MTJ supply 403 and/or MTJ supply 423 may generate the electrical signal to be an AC electrical signal. For example, supply 401 and supply 421 may generate DC regulated voltages and MTJ supply 403 and MTJ supply 423 may generate DC or AC electrical signals. In some examples, supply 401 and supply 421 may generate AC regulated voltages and MTJ supply 403 and MTJ supply 423 may generate DC or AC electrical signals. MTJ supply 403 and MTJ supply 423 may improve a signal-to-noise ratio of voltages output to comparator 440.

Figure 5:
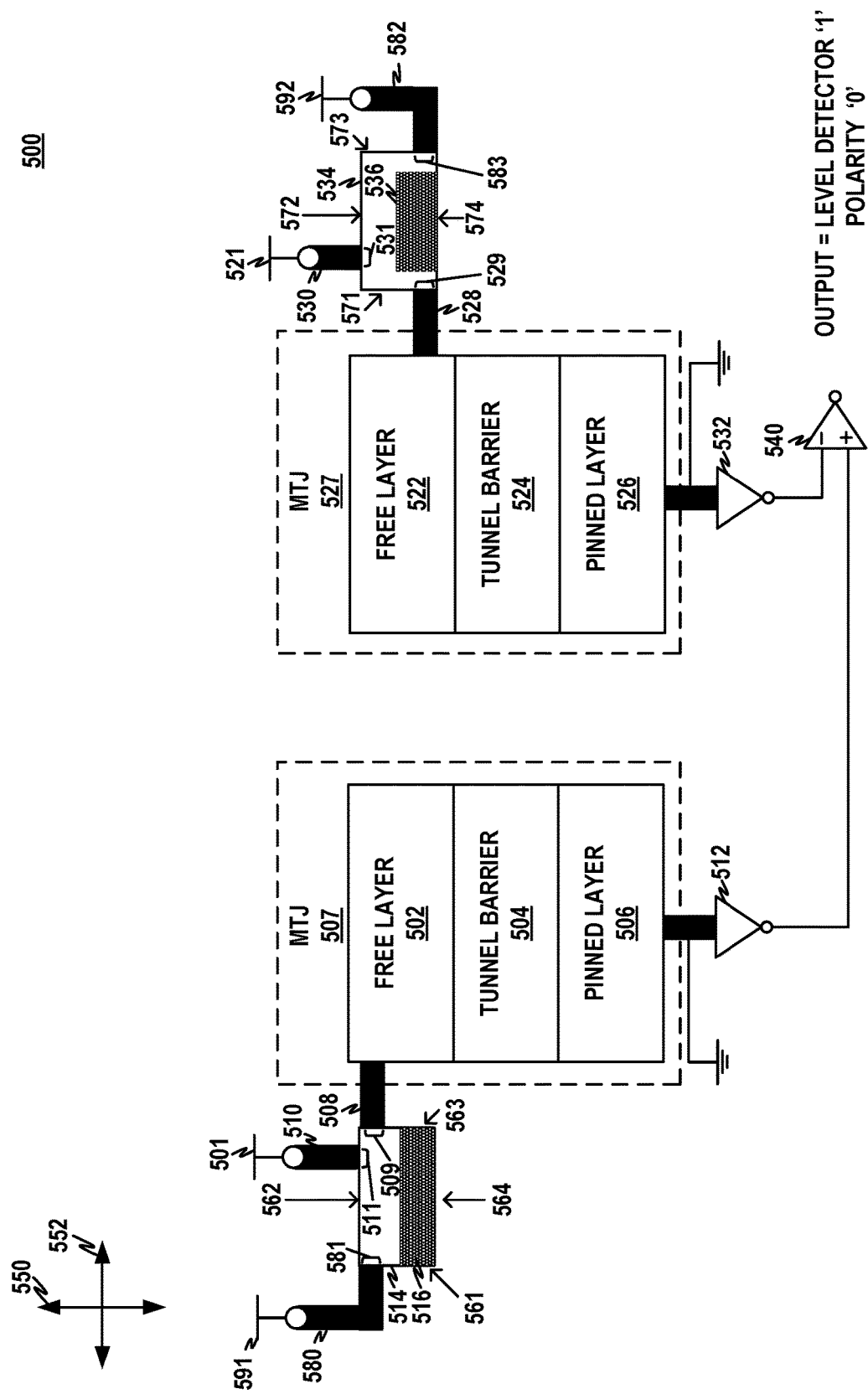
FIG. 5 shows a conceptual illustration of a fifth sensor configured to detect acceleration.

FIG. 5 shows a conceptual illustration of a fifth sensor 500 configured to detect acceleration. Sensor 500 may include supply 501, MTJ element 507, conductor 508, conductor 510, amplifier 512, reservoir 514, particles 516, supply 521, MTJ element 527, conductor 528, conductor 530, amplifier 532, reservoir 534, particles 536, and comparator 540, which may be examples of supply 101, MTJ element 107, conductor 108, conductor 110, amplifier 112, reservoir 114, particles 116, supply 121, MTJ element 127, conductor 128, conductor 130, amplifier 132, reservoir 134, particles 136, and comparator 140 of FIG. 1A, respectively.

As shown, MTJ element 507 may include free layer 502, tunnel barrier 504, and pinned layer 506 and MTJ element 527 may include free layer 522, tunnel barrier 524, and pinned layer 526. Reservoir 514 and reservoir 534 extend along first direction 550 and second direction 552. First direction 550 is perpendicular to second direction 552. In this example, MTJ element 507 and/or MTJ element 527 may be under bias and/or tunnel current flows in one device. Particles 536 are illustrated as spaced apart from left surface 571 and right side 573 only to show first portion 529 and third portion 583. That is, in some examples, particles 536 may extend to the left to directly contact first surface 571 and extend to the right to directly contact third surface 573.

As shown in FIG. 5, first reservoir 514, and second reservoir 534 extend along first direction 550 (e.g., a vertical direction) and second direction 552 (e.g., a horizontal direction). First direction 550 is perpendicular to second direction 552. As shown, first reservoir 514 comprises first surface 561, second surface 562, third surface 563 opposite from first surface 561, and fourth surface 564 opposite from second surface 562. Similarly, second reservoir 534 comprises first surface 571, second surface 572, third surface 573 opposite from first surface 571, and fourth surface 574 opposite from second surface 572.

Surfaces 561-564 of first reservoir 514 may correspond to surfaces 571-574 of second reservoir with respect to first direction 550 and second direction 552. For example, first surface 561 of first reservoir 514 may be spaced apart along second direction 552 from third surface 563 of first reservoir 514 and second surface 562 of first reservoir 514 may be spaced apart along first direction 554 from fourth surface 564 of first reservoir 514. Similarly, first surface 571 of second reservoir 534 may be spaced apart along second direction 552 from third surface 573 of second reservoir 534 and second surface 572 of second reservoir 534 may be spaced apart along first direction 554 from fourth surface 574 of second reservoir 534.

In the example of FIG. 5, conductor 580 is arranged at first surface 561 of reservoir 514, conductor 510 is arranged at second surface 562 of reservoir 514, and conductor 508 is arranged on third surface 563 of reservoir 514. Similarly, conductor 582 is arranged at third surface 573 of reservoir 534, conductor 530 is arranged at second surface 572 of reservoir 534, and conductor 528 is arranged on first surface 571 of reservoir 534. In this way, acceleration along second direction 552 (e.g., to the right) may cause particles 516 to distribute within reservoir 514 to electrically couple conductor 510 and conductor 508, which provides an acceleration signal through MTJ element 507 to comparator 540. Similarly, acceleration along second direction 552 (e.g., to the left) may cause particles 536 to distribute within reservoir 534 to electrically couple conductor 530 and conductor 528, which provides an acceleration signal through MTJ element 507 to comparator 540.

Additionally, acceleration along first direction 550 (e.g., downward) may cause particles 516 to distribute within reservoir 514 to electrically couple conductor 580 and conductor 508, which provides an acceleration signal through MTJ element 507 to comparator 540. Similarly, acceleration along first direction 550 (e.g., upward) may cause particles 536 to distribute within reservoir 534 to electrically couple conductor 582 and conductor 528, which provides an acceleration signal through MTJ element 507 to comparator 540.

For example, first portion 509 of first reservoir 514 may be arranged on third surface 563 of first reservoir 514. Second portion 511 of first reservoir 514 may be arranged on second surface 562 of first reservoir 514 adjacent to third surface 563 of first reservoir 514. Third portion 581 of first reservoir 514 is arranged on first surface 561 of first reservoir 514. In some examples, first surface 561 of first reservoir 514 and third surface 563 of first reservoir 514 may be on opposite sides of first reservoir 514. In some examples, third portion 581 of first reservoir 514 may be electrically coupled to first auxiliary voltage.

First auxiliary supply 591 (also referred to herein as simply "supply 591") may be substantially similar to supply 501, which may be an example of supply 101 of FIG. 1. For example, supply 591 may be configured to output a regulated voltage, current, or power. For instance, supply 591 may output a first auxiliary voltage that corresponds (e.g., substantially equals, equals, etc.) to a first supply voltage output by supply 501. In some instances, supply 591 may output a first auxiliary voltage different from (e.g., less than or greater than) a first supply voltage output by supply 501.

In the example of FIG. 5, first portion 509 of first reservoir 514 may be spaced closer to second surface 562 of first reservoir 514 than fourth surface 564 of first reservoir 514. In some examples, second surface 562 of first reservoir 514 and fourth surface 564 of first reservoir 514 may be on opposite sides of first reservoir 514. Third portion 581 of first reservoir 514 may be spaced closer to second surface 562 of first reservoir 514 than fourth surface 564 of first reservoir 514.

Similarly, first portion 529 of second reservoir 534 may be arranged on first surface 571 of second reservoir 534. Second portion 531 of second reservoir 534 may be arranged on second surface 572 of second reservoir 534. In some examples, second surface 572 of second reservoir 534 may be adjacent to first surface 571 of second reservoir 534. Third portion 583 of second reservoir 534 may be arranged on third surface 573 of second reservoir 534. Third surface 573 of second reservoir 534 and left surface 571 of second reservoir 534 may be on opposite sides of second reservoir 534. Third portion 583 of second reservoir 534 may be electrically coupled to a second auxiliary voltage.

Second auxiliary supply 592 (also referred to herein as simply "supply 592") may be substantially similar to supply 521, which may be an example of supply 121 of FIG. 1. For example, supply 592 may be configured to output a regulated voltage, current, or power. For instance, supply 592 may output a second auxiliary voltage that corresponds (e.g., substantially equals, equals, etc.) to a second supply voltage output by supply 521. In some instances, supply 592 may output a second auxiliary voltage different from (e.g., less than or greater than) a second supply voltage output by supply 521.

In the example of FIG. 5, first portion 529 of second reservoir 534 may be spaced closer to fourth surface 574 of second reservoir 534 than second surface 572 of second reservoir 534. Fourth surface 574 of second reservoir 534 and second surface 572 of second reservoir 534 may be on opposite sides of second reservoir 534. Third portion 583 of second reservoir 534 may be spaced closer to fourth surface 574 of second reservoir 534 than second surface 572 of second reservoir 534.

Comparator 540 may generate a polarity output of '0' in response to voltage at a positive pin of comparator 540 for MTJ element 507 being not greater than voltage at a negative pin of comparator 540 for MTJ element 527. In this example, comparator 540 may generate a polarity output of '1' in response to voltage at a positive pin of comparator 540 for MTJ element 507 being greater than voltage at a negative pin of comparator 540 for MTJ element 527. In some examples, comparator 540 may generate a level detector of '1' to indicate that voltage at the positive pin of comparator 540 for MTJ element 507 is not equal to voltage at the negative pin of comparator 540 for MTJ element 527. In some examples, sensor 500 may include an added contact pair and/or modified fill quantities/ratios, fluid viscosity, and/or particle density.

Figure 6:
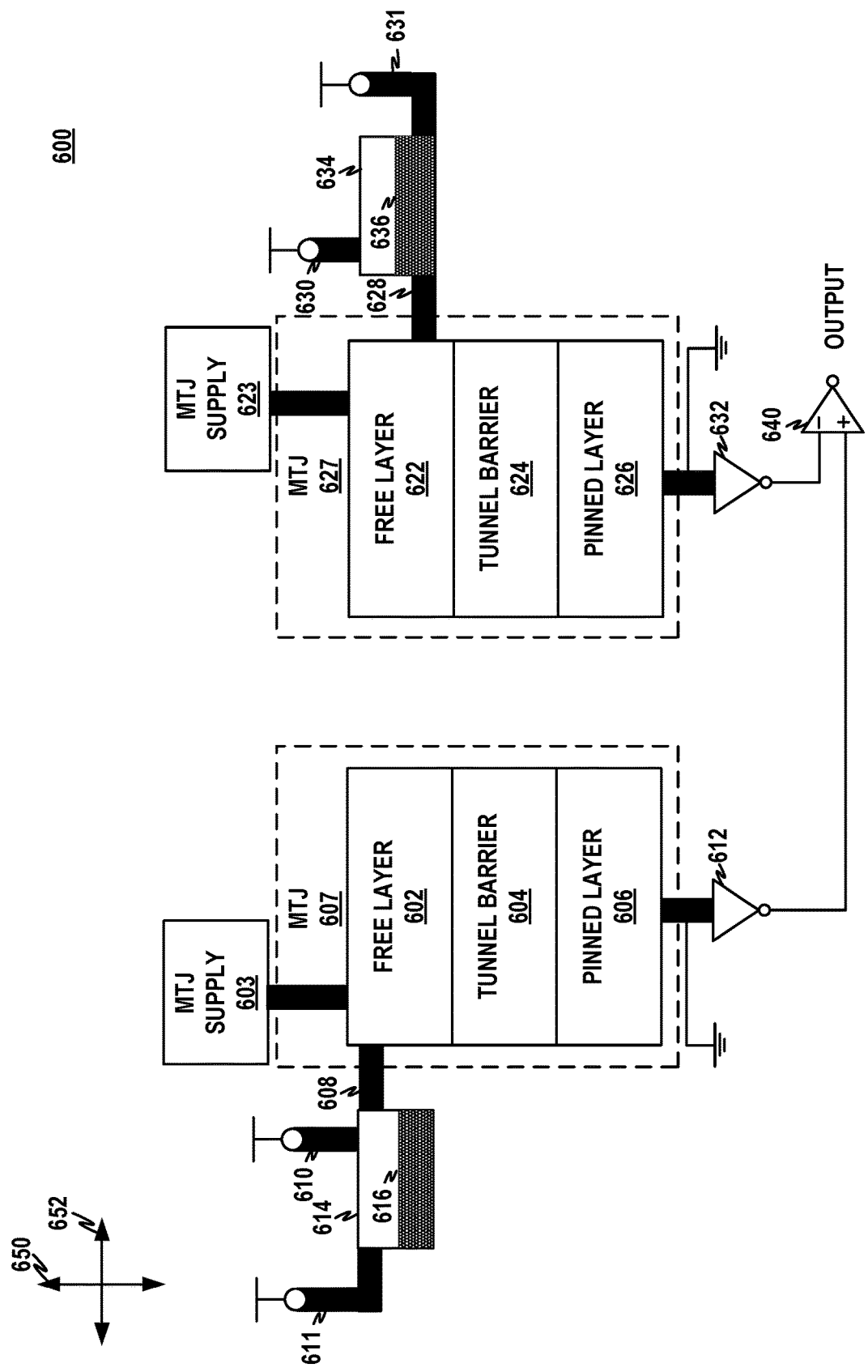
FIG. 6 shows a conceptual illustration of a sixth sensor configured to detect acceleration.

FIG. 6 shows a conceptual illustration of a sixth sensor configured to detect acceleration. Sensor 600 may include supply 601, MTJ element 607, conductor 608, conductor 610, amplifier 612, reservoir 614, particles 616, supply 621, MTJ element 627, conductor 628, conductor 630, amplifier 632, reservoir 634, particles 636, and comparator 640, which may be examples of supply 101, MTJ element 107, conductor 108, conductor 110, amplifier 112, reservoir 114, particles 116, supply 121, MTJ element 127, conductor 128, conductor 130, amplifier 132, reservoir 134, particles 136, and comparator 140 of FIG. 1A, respectively. As shown, MTJ element 607 may include free layer 602, tunnel barrier 604, and pinned layer 606 and MTJ element 627 may include free layer 622, tunnel barrier 624, and pinned layer 626. Reservoir 614 and reservoir 634 extend along first direction 650 (e.g., a vertical direction) and second direction 652 (e.g., a horizontal direction). First direction 650 is perpendicular to second direction 652.

In the example of FIG. 6, MTJ supply 603 may provide an electrical signal, referred to herein as a "third supply voltage," to free layer 602, which is conducted via tunnel barrier 604 and pinned layer 606 to a reference node (e.g., ground) of MTJ supply 603. Although FIG. 6 shows MTJ supply 603 as directly connected to free layer 602, in some examples, MTJ supply 603 is electronically coupled to free layer 602 via one or more other layers (e.g., a top electrode). Similarly, although FIG. 6 shows pinned layer 606 as directly connected to a ground node of MTJ supply 603, in some examples, pinned layer 606 is electronically coupled to the ground node of MTJ supply 603 via one or more other layers (e.g., a bottom electrode).

MTJ supply 603 may be coupled to free layer 602 using a conductor extending along first direction 650 and/or along a direction perpendicular to second direction 652 and first direction 650 (e.g., into or out of the page). In some examples, MTJ supply 603 may generate a magnetic field at MTJ 607 using a DC or AC current or a DC or AC magnetic field from the current.

Similarly, MTJ supply 623 may provide an electrical signal, referred to herein as a "fourth supply voltage," to free layer 622, which is conducted via tunnel barrier 624 and pinned layer 626 to a reference node (e.g., ground) of MTJ supply 623. Although FIG. 6 shows MTJ supply 623 as directly connected to free layer 622, in some examples, MTJ supply 623 is electronically coupled to free layer 622 via one or more other layers (e.g., a top electrode). Similarly, although FIG. 6 shows pinned layer 626 as directly connected to a ground node of MTJ supply 623, in some examples, pinned layer 626 is electronically coupled to the ground node of MTJ supply 623 via one or more other layers (e.g., a bottom electrode).

MTJ supply 623 may be coupled to free layer 622 using a conductor extending along first direction 650 and/or along a direction perpendicular to second direction 652 and first direction 650 (e.g., into or out of the page). In some examples, MTJ supply 623 may generate a magnetic field at MTJ 627 using a DC or AC current or a DC or AC magnetic field from the current.

In some examples, MTJ supply 603 and/or MTJ supply 623 may generate the electrical signal to be a DC electrical signal. In some examples, MTJ supply 603 and/or MTJ supply 623 may generate the electrical signal to be an AC electrical signal. For example, supply 601 and supply 621 may generate DC regulated voltages and MTJ supply 603 and MTJ supply 623 may generate DC or AC electrical signals. In some examples, supply 601 and supply 621 may generate AC regulated voltages and MTJ supply 603 and MTJ supply 623 may generate DC or AC electrical signals. MTJ supply 603 and MTJ supply 623 may improve a signal-to-noise ratio of voltages output to comparator 640.

Figure 7:
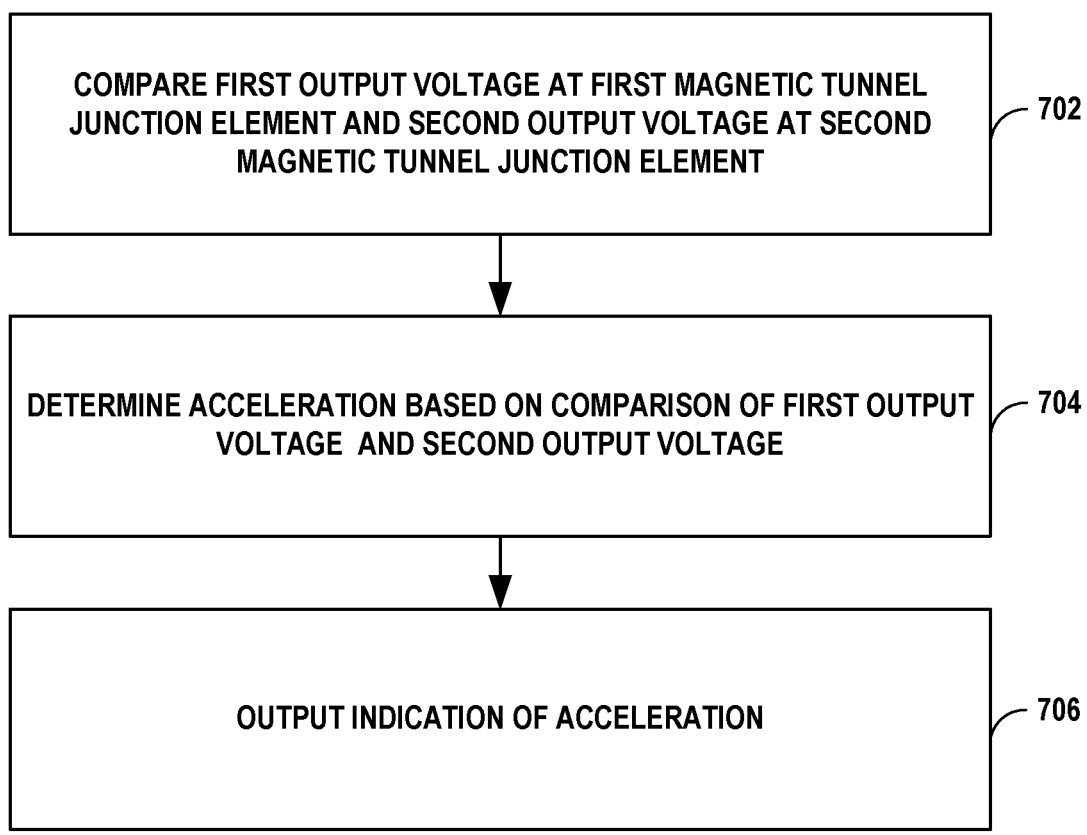
FIG. 7 shows a flowchart of a process for detecting acceleration in accordance with the techniques of this disclosure.

FIG. 7 shows a flowchart of a process for detecting acceleration in accordance with the techniques of this disclosure. The techniques of FIG. 7 may, for example, be performed by a sensor described above with respect to any combination of FIGS. 1A-1D, 2, 3A-3E, 4, 5, and 6. Processing circuitry 141 compares a first output voltage at first MTJ element 107 and a second output second at MTJ element 127 (702).

Processing circuitry 141 determines acceleration based on the comparison of the first output voltage at first MTJ element 107 and the second output voltage at second MTJ element 127 (704). For example, processing circuitry 141 (e.g., with or without comparator 140) may be configured to determine an acceleration at sensor 100 has occurred in response to determining that the first output voltage at pinned layer 106 exceeds the second output voltage at pinned layer 126 by at least a first voltage threshold. In some examples, processing circuitry 141 (e.g., with or without comparator 140) may be configured determine an acceleration at sensor 100 has occurred in response to determining that the second output voltage at pinned layer 126 exceeds the first output voltage at pinned layer 106 by at least a second voltage threshold. In some examples, the first voltage threshold is the same as the second voltage threshold. In some examples, the first voltage threshold is different from (e.g., greater than or less than) the second voltage threshold.

However, processing circuitry 141 (e.g., with or without comparator 140) may be configured determine an acceleration at sensor 100 has not occurred in response to determining that the first output voltage at pinned layer 106 does not exceed the second output voltage at pinned layer 126 by at least the first voltage threshold and the second output voltage at pinned layer 126 does not exceed the first output voltage at pinned layer 106 by at least the second voltage threshold. Processing circuitry 141 outputs an indication of the acceleration (706).

The term "circuitry" as used herein may refer to any of the foregoing structure or any other structure suitable for processing program code and/or data or otherwise implementing the techniques described herein. Circuitry may, for example, any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A magnetic tunnel junction (MTJ) based sensor device, the MTJ based sensor device comprising:
   a first MTJ element comprising a free layer, a tunnel barrier, and a pinned layer, the tunnel barrier of the first MTJ element being arranged between the free layer of the first MTJ element and the pinned layer of the first MTJ element;
   a first reservoir comprising first particles configured to move within the first reservoir during acceleration of the MTJ based sensor device, wherein a first portion of the first reservoir is electrically coupled to the free layer of the first MTJ element and wherein a second portion of the first reservoir is electrically coupled to a first supply voltage;

a second MTJ element comprising a free layer, a tunnel barrier, and a pinned layer, the tunnel barrier of the second MTJ element being arranged between the free layer of the second MTJ element and the pinned layer of the second MTJ element;

a second reservoir comprising second particles configured to move within the second reservoir during acceleration of the MTJ based sensor device, wherein a first portion of the second reservoir is electrically coupled to the free layer of the second MTJ element and wherein a second portion of the second reservoir is electrically coupled to a second supply voltage; and processing circuitry configured to determine an acceleration based on a first output voltage at the pinned layer at the first MTJ element and a second output voltage at the pinned layer at the second MTJ element.

2. The MTJ based sensor device of claim 1, wherein the first supply voltage corresponds to the second supply voltage.

3. The MTJ based sensor device of claim 1,
wherein a third supply voltage is electrically coupled to the free layer of the first MTJ element; and
wherein a fourth supply voltage is electrically coupled to the free layer of the second MTJ element.

4. The MTJ based sensor device of claim 1,
wherein the first reservoir comprises a first surface, a second surface, a third surface opposite from the first surface, and a fourth surface opposite from the second surface;
wherein the first portion of the first reservoir is arranged on the third surface of the first reservoir; and
wherein the second portion of the first reservoir is arranged on the second surface of the first reservoir.

5. The MTJ based sensor device of claim 4, wherein the first particles electronically couple the first portion of the first reservoir and the second portion of the first reservoir when the first particles are arranged within a corner of the first reservoir formed by the second of the first reservoir and the third surface of the first reservoir.

6. The MTJ based sensor device of claim 1,
wherein the second reservoir comprises a first surface, a second surface, a third surface opposite from the first surface, and a fourth surface opposite from the second surface;
wherein the first portion of the second reservoir is arranged on the first surface of the second reservoir; and
wherein the second portion of the second reservoir is arranged on the second surface of the second reservoir.

7. The MTJ based sensor device of claim 6, wherein the second particles electronically couple the first portion of the second reservoir and the second portion of the second reservoir when the second particles are arranged within a corner of the second reservoir formed by the second surface of the second reservoir and the first surface of the second reservoir.

8. The MTJ based sensor device of claim 1,
wherein the first reservoir comprises a first surface, a second surface, a third surface opposite from the first surface, and a fourth surface opposite from the second surface;
wherein the first portion of the first reservoir is arranged on the third surface of the first reservoir; and
wherein the second portion of the first reservoir is arranged on the first surface of the first reservoir.

9. The MTJ based sensor device of claim 8,
wherein the first portion of the first reservoir is spaced closer to the second surface of the first reservoir than the fourth surface of the first reservoir; and
wherein the second portion of the first reservoir is spaced closer to the second surface of the first reservoir than the fourth surface of the first reservoir.

10. The MTJ based sensor device of claim 9, wherein the first particles electronically couple the first portion of the first reservoir and the second portion of the first reservoir when the first particles are arranged closer to the second surface of the first reservoir than the fourth surface of the first reservoir.

11. The MTJ based sensor device of claim 1,
wherein the second reservoir comprises a first surface, a second surface, a third surface opposite from the first surface, and a fourth surface opposite from the second surface;
wherein the first portion of the second reservoir is arranged on the first surface of the second reservoir; and
wherein the second portion of the second reservoir is arranged on the third surface of the second reservoir.

12. The MTJ based sensor device of claim 11,
wherein the first portion of the second reservoir is spaced closer to the fourth surface of the second reservoir than the second surface of the second reservoir; and
wherein the second portion of the second reservoir is spaced closer to the fourth surface of the second reservoir than the second surface of the second reservoir.

13. The MTJ based sensor device of claim 12, wherein the second particles electronically couple the first portion of the second reservoir and the second portion of the second reservoir when the second particles are spaced closer to the fourth surface of the second reservoir than the second surface of the second reservoir.

14. The MTJ based sensor device of claim 1,
wherein the first reservoir comprises a first surface, a second surface, a third surface opposite from the first surface, and a fourth surface opposite from the second surface;
wherein the first portion of the first reservoir is arranged on the third surface of the first reservoir;
wherein the second portion of the first reservoir is arranged on the second surface of the first reservoir;
wherein a third portion of the first reservoir is arranged on the first surface of the first reservoir; and
wherein the third portion of the first reservoir is electrically coupled to a first auxiliary supply voltage.

15. The MTJ based sensor device of claim 14,
wherein the first portion of the first reservoir is spaced closer to the second surface of the first reservoir than the fourth surface of the first reservoir; and
wherein the third portion of the first reservoir is spaced closer to the second surface of the first reservoir than the fourth surface of the first reservoir.

16. The MTJ based sensor device of claim 1,
wherein the second reservoir comprises a first surface, a second surface, a third surface opposite from the first surface, and a fourth surface opposite from the second surface;
wherein the first portion of the second reservoir is arranged on the first surface of the second reservoir;
wherein the second portion of the second reservoir is arranged on the second surface of the second reservoir;

wherein a third portion of the second reservoir is arranged on the third surface of the second reservoir; and wherein the third portion of the second reservoir is electrically coupled to a second auxiliary voltage.

17. The MTJ based sensor device of claim 16, wherein the first portion of the second reservoir is spaced closer to the fourth surface of the second reservoir than the second surface of the second reservoir; and wherein the third portion of the second reservoir is spaced closer to the fourth surface of the second reservoir than the second surface of the second reservoir.

18. A method for detecting acceleration using a magnetic tunnel junction (MTJ) based sensor device, the method comprising:

comparing, by processing circuitry, a first output voltage at a first MTJ element and a second output voltage at a second MTJ element;

wherein the first MTJ element comprises a free layer, a tunnel barrier, and a pinned layer, the tunnel barrier of the first MTJ element being arranged between the free layer of the first MTJ element and the pinned layer of the first MTJ element;

wherein the second MTJ element comprises a free layer, a tunnel barrier, and a pinned layer, the tunnel barrier of the second MTJ element being arranged between the free layer of the second MTJ element and the pinned layer of the second MTJ element;

wherein a first reservoir comprises first particles configured to move within the first reservoir during acceleration of the MTJ based sensor device, wherein a first portion of the first reservoir is electrically coupled to the free layer of the first MTJ element and wherein a second portion of the first reservoir is electrically coupled to a first supply voltage;

wherein a second reservoir comprises second particles configured to move within the second reservoir during acceleration of the MTJ based sensor device, wherein a first portion of the second reservoir is electrically coupled to the free layer of the second MTJ element and wherein a second portion of the second reservoir is electrically coupled to a second supply voltage; and determining, by the processing circuitry, acceleration based on the comparison of the first output voltage at the first MTJ element and the second output voltage at the second MTJ element.

19. The method of claim 18, where determining acceleration comprises:

determining that acceleration has occurred at the MTJ based sensor device in response to determining that the first output voltage at the first MTJ element exceeds the second output voltage at the second MTJ element by at least a first voltage threshold;

determining that acceleration has occurred at the MTJ based sensor device in response to determining that the second output voltage at the second MTJ element exceeds the first output voltage at the first MTJ element by at least a second voltage threshold; and determining that no acceleration has occurred at the MTJ based sensor device in response to determining that the first output voltage at the first MTJ element does not exceed the second output voltage at the second MTJ element by at least the first voltage threshold and the second output voltage at the second MTJ element does not exceed the first output voltage at the first MTJ element by at least the second voltage threshold.

20. A magnetic tunnel junction (MTJ) based sensor device, the MTJ based sensor device comprising:

means for comparing a first output voltage at a first MTJ element and a second output voltage at a second MTJ element;

wherein the first MTJ element comprises a free layer, a tunnel barrier, and a pinned layer, the tunnel barrier of the first MTJ element being arranged between the free layer of the first MTJ element and the pinned layer of the first MTJ element;

wherein the second MTJ element comprises a free layer, a tunnel barrier, and a pinned layer, the tunnel barrier of the second MTJ element being arranged between the free layer of the second MTJ element and the pinned layer of the second MTJ element;

wherein a first reservoir comprises first particles configured to move within the first reservoir during acceleration of the MTJ based sensor device, wherein a first portion of the first reservoir is electrically coupled to the free layer of the first MTJ element and wherein a second portion of the first reservoir is electrically coupled to a first supply voltage;

wherein a second reservoir comprises second particles configured to move within the second reservoir during acceleration of the MTJ based sensor device, wherein a first portion of the second reservoir is electrically coupled to the free layer of the second MTJ element and wherein a second portion of the second reservoir is electrically coupled to a second supply voltage; and means for determining acceleration based on the comparison of the first output voltage at the first MTJ element and the second output voltage at the second MTJ element.

* * * * *